US012485675B2

(12) United States Patent
Kim

(10) Patent No.: US 12,485,675 B2
(45) Date of Patent: Dec. 2, 2025

(54) METHOD OF SETTING INKJET PRINTING AND METHOD OF MANUFACTURING DISPLAY APPARATUS BY USING THE SAME

(71) Applicant: SAMSUNG DISPLAY CO., LTD., Yongin-si (KR)

(72) Inventor: Dongsul Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 197 days.

(21) Appl. No.: 18/109,412

(22) Filed: Feb. 14, 2023

(65) Prior Publication Data

US 2023/0382117 A1 Nov. 30, 2023

(30) Foreign Application Priority Data

May 27, 2022 (KR) ........................ 10-2022-0065286

(51) Int. Cl.

| | |
|---|---|
| ***B41J 2/21*** | (2006.01) |
| ***B41J 2/14*** | (2006.01) |
| ***B41J 2/145*** | (2006.01) |
| ***B41J 2/165*** | (2006.01) |
| ***H10K 71/13*** | (2023.01) |

(52) U.S. Cl.

CPC ............ *B41J 2/145* (2013.01); *H10K 71/135* (2023.02)

(58) Field of Classification Search

CPC ...... B41J 2/2142; B41J 2/2139; B41J 2/2132; B41J 2/2054; B41J 2/16579; B41J 2/0451; B41J 2/145; B41J 29/393; H10K 71/135; H10K 71/00; H10K 71/13

See application file for complete search history.

(56) References Cited

U.S. PATENT DOCUMENTS

| | | | | |
|---|---|---|---|---|
| 11,110,730 B2 | 9/2021 | Kim et al. | | |
| 2010/0045716 A1* | 2/2010 | Sugahara | ................. | B41J 29/38 347/9 |
| 2018/0147834 A1 | 5/2018 | Jang | | |

FOREIGN PATENT DOCUMENTS

| | | |
|---|---|---|
| KR | 1020160031201 A | 3/2016 |
| KR | 1020180060898 A | 6/2018 |
| KR | 1020200053056 A | 5/2020 |
| KR | 102237721 B1 | 4/2021 |

* cited by examiner

*Primary Examiner* — Jason S Uhlenhake

(74) *Attorney, Agent, or Firm* — CANTOR COLBURN LLP

(57) ABSTRACT

A method of setting inkjet printing includes arranging a first head including a plurality of first nozzles arranged in a first direction over one row including a plurality of dotting areas, such that an outermost first nozzle from among the plurality of first nozzles corresponds to an outermost dotting area from among the plurality of dotting areas, identifying, from among the plurality of dotting areas, dotting areas for which corresponding ones of the plurality of first nozzles do not exist as first dotting areas, and, changing a position of the first head over the one row while changing a first nozzle corresponding to an outermost dotting area from among the first dotting areas, and, when a number of dotting areas from among the first dotting areas for which corresponding ones of the plurality of first nozzles exist is maximized, identifying the first nozzle as a first target nozzle.

3 Claims, 20 Drawing Sheets

METHOD OF SETTING INKJET PRINTING AND METHOD OF MANUFACTURING DISPLAY APPARATUS BY USING THE SAME

This application claims priority to Korean Patent Application No. 10-2022-0065286, filed on May 27, 2022, and all the benefits accruing therefrom under 35 U.S.C. § 119, the content of which in its entirety is herein incorporated by reference.

BACKGROUND

1. Field

Embodiments relate to a method of setting inkjet printing and a method of manufacturing a display apparatus by the same, and more particularly, to a method of setting inkjet printing, by which inkjet printing may be performed efficiently, and a method of manufacturing a display apparatus by the same.

2. Description of the Related Art

In the case of a display apparatus, such as an organic light-emitting display apparatus, it may be desired to form a layer for each pixel during a manufacturing process. Emission layers disposed on pixel electrodes are spaced apart from each other, and each emission layer is formed on its corresponding pixel electrode, for example. Accordingly, an emission layer is formed by an inkjet printing method or the like.

SUMMARY

In the case of an inkjet printing method of the related art, excessive time is desired in a process of forming emission layers and the like.

Embodiments include a method of setting inkjet printing, by which inkjet printing may be performed efficiently, and a method of manufacturing a display apparatus by the same. However, this is merely an example, and the scope of embodiments is not limited thereto.

Additional features will be set forth in part in the description which follows and, in part, will be apparent from the description, or may be learned by practice of the presented embodiments of the disclosure.

According to embodiments, a method of setting inkjet printing includes arranging a first head including a plurality of first nozzles arranged in a first direction over one row including a plurality of dotting areas, such that the plurality of first nozzles is arranged over the one row, and such that an outermost first nozzle from among the plurality of first nozzles corresponds to an outermost dotting area from among the plurality of dotting areas, identifying, from among the plurality of dotting areas, dotting areas for which corresponding ones of the plurality of first nozzles do not exist as first dotting areas, and changing a position of the first head over the one row while changing a first nozzle, from among the plurality of first nozzles, corresponding to an outermost dotting area from among the first dotting areas, and, when a number of dotting areas from among the first dotting areas for which corresponding ones of the plurality of first nozzles exist is maximized, identifying the first nozzle from among the plurality of first nozzles which corresponds to the outermost dotting area from among the first dotting areas as a first target nozzle.

The method may further include, in a state in which the first head is arranged over the one row such that the first target nozzle corresponds to the outermost dotting area from among the first dotting areas, identifying, from among the first dotting areas, dotting areas for which corresponding ones of the plurality of first nozzles do not exist as second dotting areas, and changing the position of the first head over the one row while changing a first nozzle, from among the plurality of first nozzle, corresponding to an outermost dotting area from among the second dotting areas, and, when a number of dotting areas from among the second dotting areas for which corresponding ones of the plurality of first nozzles exist is maximized, identifying the first nozzle from among the plurality of first nozzles that corresponds to the outermost dotting area from among the second dotting areas as a second target nozzle.

According to embodiments, a method of manufacturing a display apparatus includes arranging a first head including a plurality of first nozzles arranged in a first direction over one row including a plurality of dotting areas, such that the plurality of first nozzles is arranged over the one row, and an outermost first nozzle from among the plurality of first nozzles corresponds to an outermost dotting area from among the plurality of dotting areas, a first dotting operation of dotting ink while moving the first head relative to the plurality of dotting areas in a second direction intersecting with the first direction, arranging the first head such that the first target nozzle identified by the method of setting inkjet printing from among the plurality of first nozzles is arranged over an outermost dotting area of dotting areas that are not dotted with the ink from among the plurality of dotting areas of the one row, and a second dotting operation of dotting the ink while moving the first head relative to the plurality of dotting areas in the second direction by, from among the plurality of first nozzles, first nozzles corresponding to the dotting areas that are not dotted with the ink from among the plurality of dotting areas of the one row.

According to embodiments, a method of setting inkjet printing includes arranging a headset comprising a first head and a second head, the first head including a plurality of first nozzles arranged in a first direction and the second head including a plurality of second nozzles arranged in the first direction, such that the plurality of first nozzles is arranged over one row including a plurality of dotting areas, and such that an outermost first nozzle from among the plurality of first nozzles corresponds to an outermost dotting area from among the plurality of dotting areas, identifying, from among the plurality of dotting areas, dotting areas for which corresponding ones of the plurality of first nozzles or the plurality of second nozzles do not exist as first dotting areas, and changing a position of the headset over the one row while changing a first nozzle or second nozzle, from among the plurality of first nozzles and the plurality of second nozzles, corresponding to an outermost dotting area from among the first dotting areas, and, when a number of dotting areas from among the first dotting areas for which corresponding ones of the plurality of first nozzles or the plurality of second nozzles exist is maximized, identifying the first nozzle or second nozzle from among the plurality of first nozzles and the plurality of second nozzles which corresponds to the outermost dotting area from among the first dotting areas as a first target nozzle.

The method may further include, in a state in which the headset is arranged over the one row such that the first target nozzle corresponds to the outermost dotting area from among the first dotting areas, identifying, from among the first dotting areas, dotting areas for which corresponding ones of the plurality of first nozzles and the plurality of second nozzles do not exist as second dotting areas, and changing the position of the headset over the one row while changing a first nozzle or second nozzle, from among the plurality of first nozzles and the plurality of second nozzles, corresponding to an outermost dotting area from among the second dotting areas, and, when a number of dotting areas from among the second dotting areas for which corresponding ones of the plurality of first nozzles and the plurality of second nozzles exist is maximized, identifying the first nozzle or second nozzle among the plurality of first nozzles and the plurality of second nozzles which corresponds to the outermost dotting area from among the second dotting areas as a second target nozzle.

According to embodiments, a method of manufacturing a display apparatus includes arranging a headset comprising a first head and a second head, the first head including a plurality of first nozzles arranged in a first direction and the second head including a plurality of second nozzles arranged in the first direction, such that the plurality of first nozzles is arranged over one row including a plurality of dotting areas, and such that an outermost first nozzle from among the plurality of first nozzles corresponds to an outermost dotting area from among the plurality of dotting areas, a first dotting operation of dotting ink by the plurality of first nozzles and the plurality of second nozzles while moving the headset relative to the plurality of dotting areas in a second direction intersecting with the first direction, arranging the headset such that the first target nozzle identified by the method of setting inkjet printing from among the plurality of first nozzles and the plurality of second nozzles is arranged over an outermost dotting area of dotting areas that are not dotted with the ink from among the plurality of dotting areas of the one row, and a second dotting operation of dotting the ink while moving the headset relative to the plurality of dotting areas in the second direction by, from among the plurality of first nozzles and the plurality of second nozzles, first nozzles and second nozzles corresponding to the dotting areas that are not dotted with the ink from among the plurality of dotting areas of the one row.

According to embodiments, a method of setting inkjet printing includes arranging a headset comprising a first head and a second head, the first head including a plurality of first nozzles arranged in a first direction and the second head including a plurality of second nozzles arranged in the first direction, such that the plurality of first nozzles is arranged over one row including a plurality of dotting areas, and such that an outermost first nozzle from among the plurality of first nozzles corresponds to an outermost dotting area from among the plurality of dotting areas arranged on the one row, identifying, from among the plurality of dotting areas, dotting areas for which corresponding ones of the plurality of first nozzles and the plurality of second nozzles do not exist as first dotting areas, and changing a position of the headset over the one row while changing a first nozzle or second nozzle, from among the plurality of first nozzles and the plurality of second nozzles, corresponding to an outermost dotting area from among the first dotting areas, and, when a number of dotting areas from among the first dotting areas for which corresponding ones of the plurality of first nozzles or the plurality of second nozzles exist is maximized, identifying the first nozzle or second nozzle from among the plurality of first nozzles and the plurality of second nozzles which corresponds to the outermost dotting area from among the first dotting areas as a first target nozzle.

The method may further include, in a state in which the headset is arranged over the one row such that the first target nozzle corresponds to the outermost dotting area from among the first dotting areas, identifying, from among the first dotting areas, dotting areas for which corresponding ones of the plurality of first nozzles and the plurality of second nozzles do not exist as second dotting areas, and changing the position of the headset over the one row while changing a first nozzle or second nozzle, from among the plurality of first nozzles and the plurality of second nozzles, corresponding to an outermost dotting area from among the second dotting areas, and, when a number of dotting areas from among the second dotting areas for which corresponding ones of the plurality of first nozzles and the plurality of second nozzles exist is maximized, identifying the first nozzle or second nozzle among the plurality of first nozzles and the plurality of second nozzles which corresponds to the outermost dotting area from among the second dotting areas as a second target nozzle.

According to embodiments, a method of manufacturing a display apparatus includes arranging a headset comprising a first head and a second head, the first head including a plurality of first nozzles arranged in a first direction, and the second head including a plurality of second nozzles arranged in the first direction, such that the plurality of first nozzles is arranged over one row including a plurality of dotting areas, and such that an outermost first nozzle from among the plurality of first nozzles corresponds to an outermost dotting area from among the plurality of dotting areas, a first dotting operation of dotting ink by the plurality of first nozzles and the plurality of second nozzles while moving the headset relative to the plurality of dotting areas in a second direction intersecting with the first direction, arranging the headset such that the first target nozzle identified by the method of setting inkjet printing from among the plurality of first nozzles and the plurality of second nozzles is arranged over an outermost dotting area of dotting areas that are not dotted with the ink and dotting areas that are dotted with the ink only once from among the plurality of dotting areas of the one row, and a second dotting operation of dotting the ink while moving the headset relative to the plurality of dotting areas in the second direction by, from among the plurality of first nozzles and the plurality of second nozzles, first nozzles and second nozzles corresponding to the dotting areas that are not dotted with the ink and the dotting areas that are dotted with the ink only once from among the plurality of dotting areas of the one row.

These and/or other features will become apparent and more readily appreciated from the following description of the embodiments, the claims, and the accompanying drawings.

BRIEF DESCRIPTION OF THE DRAWINGS

The above and other features and advantages of predetermined embodiments of the disclosure will be more apparent from the following description taken in conjunction with the accompanying drawings, in which.

DETAILED DESCRIPTION

Figure 1:
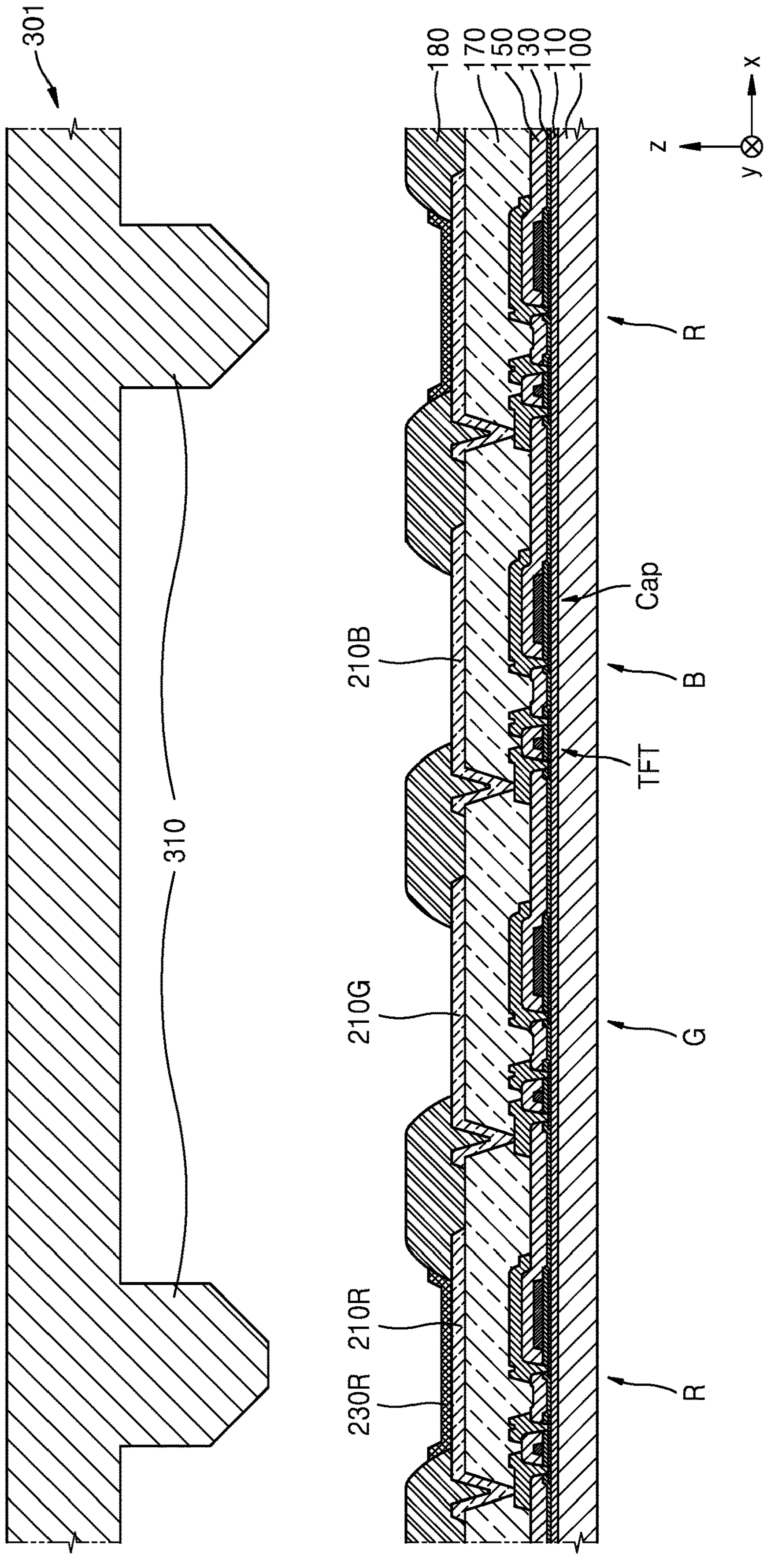
FIG. 1 is a cross-sectional view schematically illustrating an embodiment of a process of a method of manufacturing a display apparatus.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. Effects and features of the disclosure, and methods of achieving them will become apparent with reference to the embodiments described below in detail in conjunction with the drawings. However, the disclosure is not limited to the embodiments disclosed below, and may be implemented in various forms.

Hereinafter, embodiments of the disclosure will be described in detail with reference to the accompanying drawings. When describing embodiments with reference to the drawings, the same or corresponding components are denoted by the same reference numerals, and redundant descriptions thereof are omitted.

It will be understood that when a component, such as a layer, a film, a region, or a plate, is referred to as being "on" another component, the component can be directly on the other component or intervening components may be present thereon. Sizes of components in the drawings may be exaggerated or reduced for convenience of explanation. Since sizes and thicknesses of components in the drawings are arbitrarily illustrated for convenience of explanation, for example, the disclosure is not limited thereto.

In the following embodiments, the x-axis, y-axis, and z-axis are not limited to three axes on a Cartesian coordinate system, and may be interpreted in a broad sense including them. The x-axis, the y-axis, and the z-axis may be perpendicular to one another, or may represent different directions that are not perpendicular to one another, for example.

FIG. 1 is a cross-sectional view schematically illustrating an embodiment of a process of a method of manufacturing a display apparatus.

As shown in FIG. 1, after forming a buffer layer 110, a gate insulating layer 130, an inter-insulating layer 150, and a planarization layer 170 on a substrate 100, pixel electrodes 210R, 210G, and 210B are formed on the planarization layer 170.

A semiconductor layer may be formed between the buffer layer 110 and the gate insulating layer 130, a gate electrode may be formed between the gate insulating layer 130 and the inter-insulating layer 150, and a source electrode and a drain electrode may be formed between the inter-insulating layer 150 and the planarization layer 170, thereby forming a thin-film transistor TFT. The process may be variously modified. In an embodiment, one of the source electrode and the drain electrode may be omitted, for example. Furthermore, a lower capacitor electrode may be formed between the gate insulating layer 130 and the inter-insulating layer 150, and an upper capacitor electrode may be formed between the inter-insulating layer 150 and the planarization layer 170, thereby forming a capacitor Cap. When the pixel electrodes 210R, 210G, and 210B are formed on the planarization layer 170, each of the pixel electrodes 210R, 210G, and 2108 may be electrically connected to its corresponding thin-film transistor TFT.

The substrate 100 may include glass, metal, or polymer resin. When at least a portion of the display apparatus is a bending area where the display apparatus is bent or flexible, the substrate 100 needs to be flexible or bendable. In this case, the substrate 100 may include polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified. In an embodiment, the substrate 100 may have a multi-layered structure including two layers and a barrier layer arranged therebetween, the two layers each including polymer resin, and the barrier layer including an inorganic material, such as silicon oxide, silicon nitride, or silicon oxynitride, for example.

The buffer layer 110, the gate insulating layer 130, and the inter-insulating layer 150 may each include an inorganic material, such as silicon oxide, silicon nitride, or silicon oxynitride. The planarization layer 170 may include photoresist, benzocyclobutene ("BCB"), polyimide, hexamethyldisiloxane ("HMDSO"), polymethylmethacrylate ("PMMA"), polystyrene, a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or any combinations thereof.

The semiconductor layer included in the thin-film transistor TFT may include amorphous silicon or polysilicon, and, when desired, may include an oxide semiconductor.

The gate electrode included in the thin-film transistor TFT may include silver (Ag), an Ag-containing alloy, molybdenum (Mo), a Mo-containing alloy, aluminum (Al), an Al-containing alloy, aluminum nitride (AlN), tungsten (W), tungsten nitride (WN), copper (Cu), nickel (Ni), chrome (Cr), chrome nitride (CrN), titanium (Ti), tantalum (Ta), platinum (Pt), scandium (Sc), indium tin oxide ("ITO"), indium zinc oxide ("IZO"), or the like. The gate electrode may have a multi-layered structure. In an embodiment, the gate electrode may have a two-layered structure of Mo/Al or a three-layered structure of Mo/Al/Mo, for example. The same applies to the lower capacitor electrode included in the capacitor Cap.

The source electrode and/or the drain electrode included in the thin-film transistor TFT may include Ag, an Ag-containing alloy, Mo, a Mo-containing alloy, Al, an Al-containing alloy, AlN, W, WN, Cu, Ni, Cr, CrN, Ti, Ta, Pt, Sc, ITO, IZO, or the like. The source electrode and/or the drain electrode may have a multi-layered structure. In an embodiment, the source electrode and/or the drain electrode may have a two-layered structure of Ti/Al or a three-layered structure of Ti/Al/Ti, for example. The same applies to the upper capacitor electrode included in the capacitor Cap.

The pixel electrodes 210R, 210G, and 210B disposed on the planarization layer 170 may be (semi-)transmissive electrodes or reflective electrodes. In an embodiment, each of the pixel electrodes 210R, 210G, and 210B may include a reflective layer and a transparent or semi-transparent electrode layer disposed on the reflective layer, the reflective layer including Ag, magnesium (Mg), Al, Pt, palladium (Pd), gold (Au), Ni, neodymium (Nd), iridium (Ir), Cr, and any combinations thereof, for example. The transparent or semi-transparent electrode layer may include at least one selected from among ITO, IZO, zinc oxide ($ZnO_x$: ZnO or $ZnO_2$), indium oxide ($In_2O_3$), indium gallium oxide ("IGO"), and aluminum zinc oxide ("AZO"). In an embodiment, each of the pixel electrodes 210R, 210G, and 210B may have a three-layered structure of ITO/Ag/ITO, for example.

After forming the pixel electrodes 210R, 210G, and 210B on the planarization layer 170 as described above, a pixel-defining layer 180 is formed to cover edges of each of the pixel electrodes 210R, 210G, and 210B. The pixel-defining layer 180 may prevent an arc or the like from occurring at the edge of each of the pixel electrodes 210R, 210G, and 210B by increasing a distance between the edge of each of the pixel electrodes 210R, 210G, and 210B and an opposite electrode to be formed above the pixel electrodes 210R, 210G, and 210B. The pixel-defining layer 180 may include at least one organic insulating material selected from among polyimide, polyamide, acrylic resin, BCB, and phenolic resin, and may be formed by spin coating or the like.

Thereafter, a hole transport layer ("HTL") and/or a hole injection layer ("HIL") are formed on the pixel electrodes 210R, 210G, and 210B, wherein each of the HTL and the HIL may be unitary as a single body throughout the pixel electrodes 210R, 210G, and 210B. The HTL and/or the HIL may be formed by a vapor deposition method or the like.

Subsequently, as shown in FIG. 1, an emission layer may be formed by an inkjet printing method. In FIG. 1, red emission layers 230R are respectively formed on the pixel electrodes 210R corresponding to red pixels by an inkjet printing method. Likewise, green emission layers may be respectively formed on the pixel electrodes 210G corresponding to green pixels by the inkjet printing method, and blue emission layers may be respectively formed on the pixel electrodes 210B corresponding to blue pixels by the inkjet printing method.

After forming the emission layers as described above, an electron transport layer ("ETL") and/or an electron injection layer ("EIL") is formed, wherein each of the ETL and the EIL may be unitary as a single body throughout the pixel electrodes 210R, 210G, and 2108. The ETL and/or the EIL may be formed by a vapor deposition method or the like.

After forming the emission layers and functional layers as described above, an opposite electrode is unitary as a single body throughout the pixel electrodes 210R, 210G, and 210B. The opposite electrode may be a light-transmitting electrode or a reflective electrode. In an embodiment, the opposite electrode may be a transparent or semi-transparent electrode, and may include a metal thin-film including lithium (Li), calcium (Ca), lithium fluoride (LiF), Al, Ag, Mg, and any combinations thereof having a small work function, for example. In addition, the opposite electrode may further include a transparent conductive oxide ("TCO") layer, such as an ITO layer, an IZO layer, a ZnO or $ZnO_2$ layer, or an $In_2O_3$ layer, disposed on the metal thin-film.

In the method of manufacturing a display apparatus as described above, emission layers may be formed by an inkjet printing method. Hereinafter, a process of forming the emission layers by the inkjet printing method is described with reference to FIGS. 2 to 10.

Figure 2:
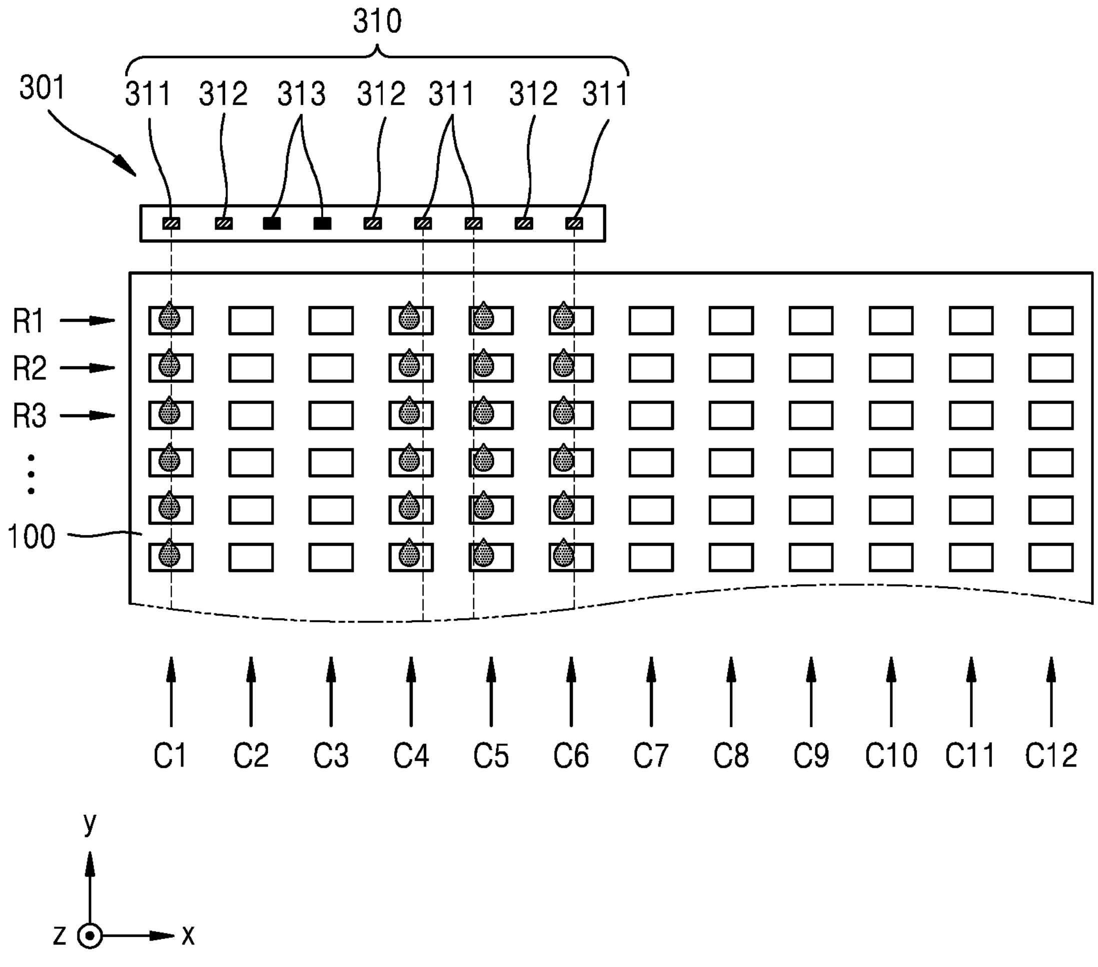
FIGS. 2 to 7 are conceptual views schematically illustrating a comparative example of processes of a method of manufacturing a display apparatus.

First, as shown in FIG. 2, a first head 301 including a plurality of first nozzles 310 arranged in a first direction (x-axis direction) is disposed above the substrate 100. There may be a plurality of dotting areas on the substrate 100. In FIG. 2, for convenience, areas where green emission layers are to be formed and areas where blue emission layers are to be formed are omitted, and all areas are shown as areas where red emission layers are to be formed.

As shown in FIG. 2, the plurality of dotting areas on the substrate 100 may be arranged in a plurality of rows R1, R2, and R3 extending in the first direction (x-axis direction). The plurality of dotting areas on the substrate 100 may be understood as being arranged in a plurality of columns C1 to C12 extending in a second direction (y-axis direction) that intersects with the first direction (x-axis direction).

To perform inkjet printing, the first head 301 having the plurality of first nozzles 310 arranged in the first direction (x-axis direction) is arranged such that the plurality of first nozzles 310 is arranged over one row including a plurality of dotting areas. In an embodiment, the first head 301 may be arranged over a first row R1 arranged uppermost in the second direction (y-axis direction), for example. In this case, the first head 301 may be arranged such that an outermost (e.g., leftmost) first nozzle from among the plurality of first nozzles 310 corresponds to a leftmost dotting area from among a plurality of dotting areas arranged on the first row R1, that is, a dotting area arranged on a first column C1 arranged leftmost in a direction opposite to the first direction (x-axis direction). The plurality of first nozzles 310 may include first nozzles 313 that do not operate. Accordingly, the term "leftmost first nozzle from among the plurality of first nozzles 310" refers to a leftmost first nozzle from among operating nozzles of the plurality of first nozzles 310. The same applies to the embodiments described below and modifications thereof.

Even when the standard or the like of a display apparatus to be manufactured is changed, a distance between the first nozzles 310 of the first head 301 used for inkjet printing in the manufacture of the display apparatus is not changed. Accordingly, even when the first head 301 having the plurality of first nozzles 310 arranged in the first direction (x-axis direction), which is used for inkjet printing, is arranged such that the plurality of first nozzles 310 is arranged over one row including a plurality of dotting areas, the plurality of first nozzles 310 may not correspond to the plurality of dotting areas on a one-to-one basis.

In FIG. 2, the plurality of first nozzles 310 of the first head 301 includes first nozzles 311 corresponding to the dotting areas and first nozzles 312 not corresponding to the dotting areas. In addition, in FIG. 2, the plurality of first nozzles 310 includes the first nozzles 313 that do not operate due to a failure. When there are first nozzles that correspond to the dotting areas but do not operate due to a failure, those first nozzles are not considered as belonging to the first nozzles 311 corresponding to the dotting areas. Accordingly, in FIG. 2, from among nine first nozzles 310 included in the first head 301, four first nozzles 311 arranged at first, sixth, seventh, and ninth positions correspond to the dotting areas.

In this state, the first head 301 is relatively moved in the second direction (y-axis direction) with respect to the substrate 100, and a material for forming a red emission layer is dotted on the substrate 100, so that red emission layers are formed by dotting the material for forming a red emission layer on dotting areas arranged on the first column C1, a fourth column C4, a fifth column C5, and a sixth column C6.

Thereafter, in the case of a method of manufacturing a display apparatus, according to a comparative example, red emission layers are formed by dotting the material for forming a red emission layer in other dotting areas through a process as shown in FIGS. 3 to 7.

Figure 3:
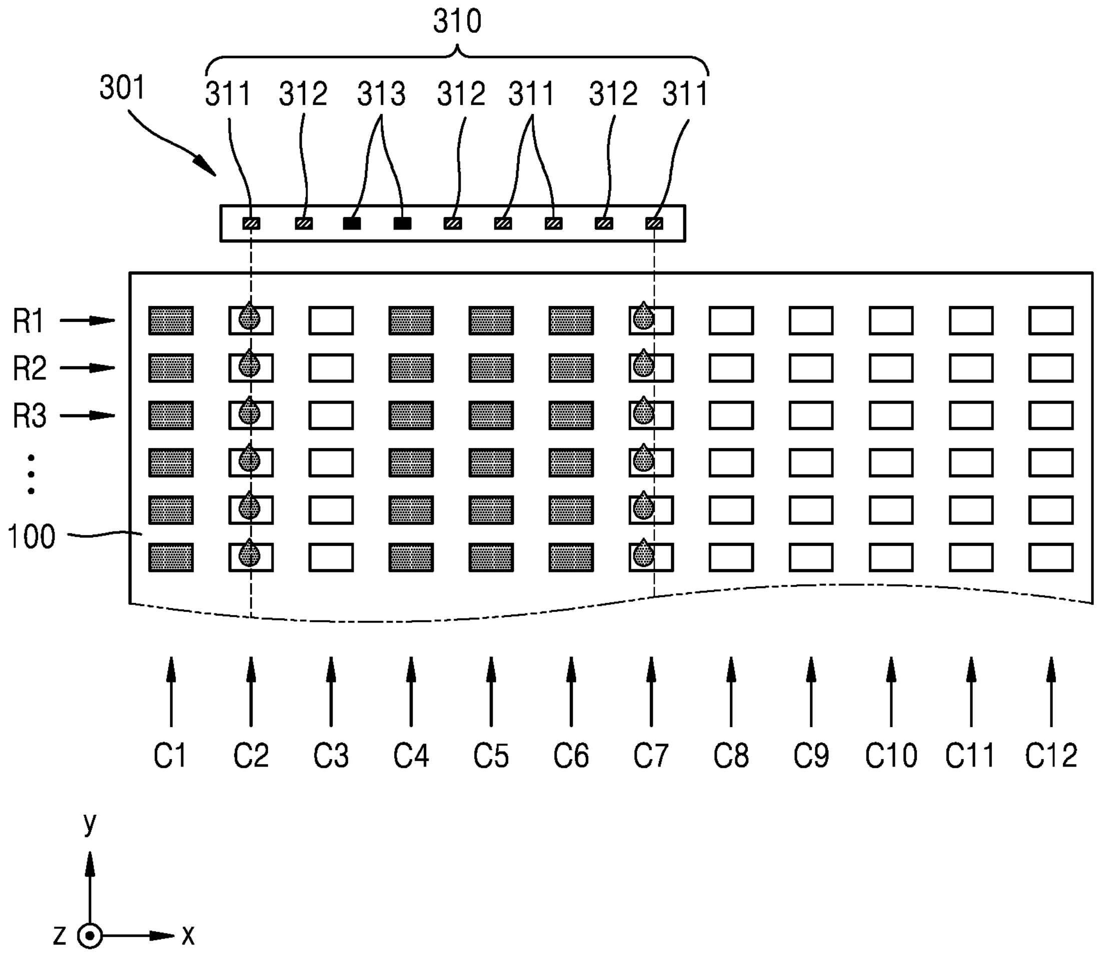

In detail, as shown in FIG. 3, the first head 301 is arranged such that a leftmost first nozzle 311 from among the plurality of first nozzles 310 corresponds to a leftmost dotting area of undotted dotting areas from among the plurality of dotting areas arranged on the first row R1. For reference, in FIG. 3, dotting areas that have been dotted are indicated using hatching. The same applies to the other drawings. In FIG. 3, the first head 301 is arranged such that the leftmost first nozzle 311 from among the plurality of first nozzles 310 corresponds to a second column C2. In this situation, from among the plurality of first nozzles 310 of the first head 301, those corresponding to the undotted dotting areas are identified. In FIG. 3, from among the nine first nozzles 310 included in the first head 301, two first nozzles 311 arranged at the first and ninth positions correspond to the undotted dotting areas. In this state, the first head 301 is relatively moved in the second direction (y-axis direction) with respect to the substrate 100, and the material for forming a red emission layer is dotted on the substrate 100, so that red emission layers are formed by dotting the material for forming a red emission layer on dotting areas arranged on the second column C2 and a seventh column C7.

Figure 4:
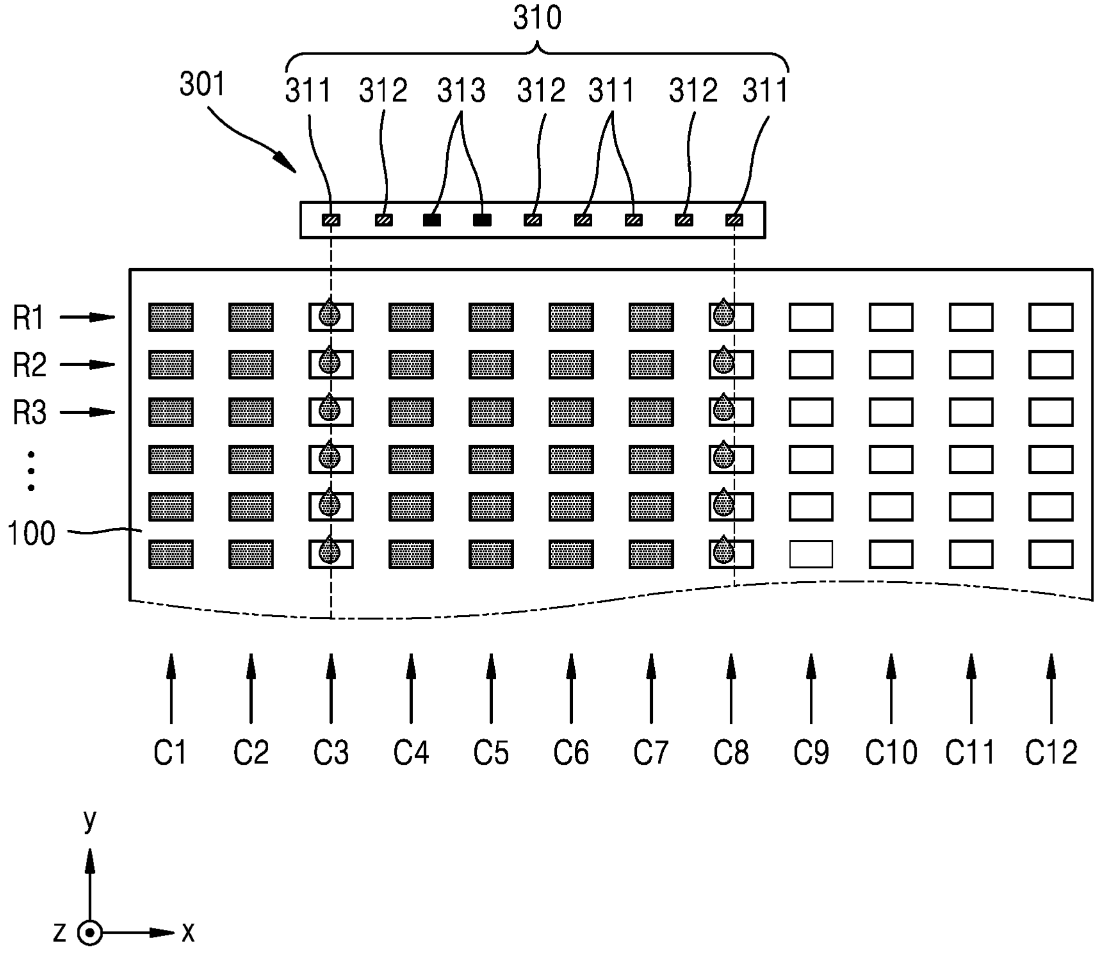

Subsequently, as shown in FIG. 4, the first head 301 is arranged such that the leftmost first nozzle 311 from among the plurality of first nozzles 310 corresponds to the leftmost dotting area of the undotted dotting areas from among the plurality of dotting areas arranged on the first row R1. In FIG. 4, the first head 301 is arranged such that the leftmost first nozzle 311 from among the plurality of first nozzles 310 corresponds to a third column C3. In this situation, from among the plurality of first nozzles 310 of the first head 301, those corresponding to the undotted dotting areas are identified. In FIG. 4, from among the nine first nozzles 310 included in the first head 301, the two first nozzles 311 arranged at the first and ninth positions correspond to the undotted dotting areas. In this state, the first head 301 is relatively moved in the second direction (y-axis direction) with respect to the substrate 100, and the material for forming a red emission layer is dotted on the substrate 100, so that red emission layers are formed by dotting the material for forming a red emission layer on dotting areas arranged on the third column C3 and an eighth column C8.

Figure 5:
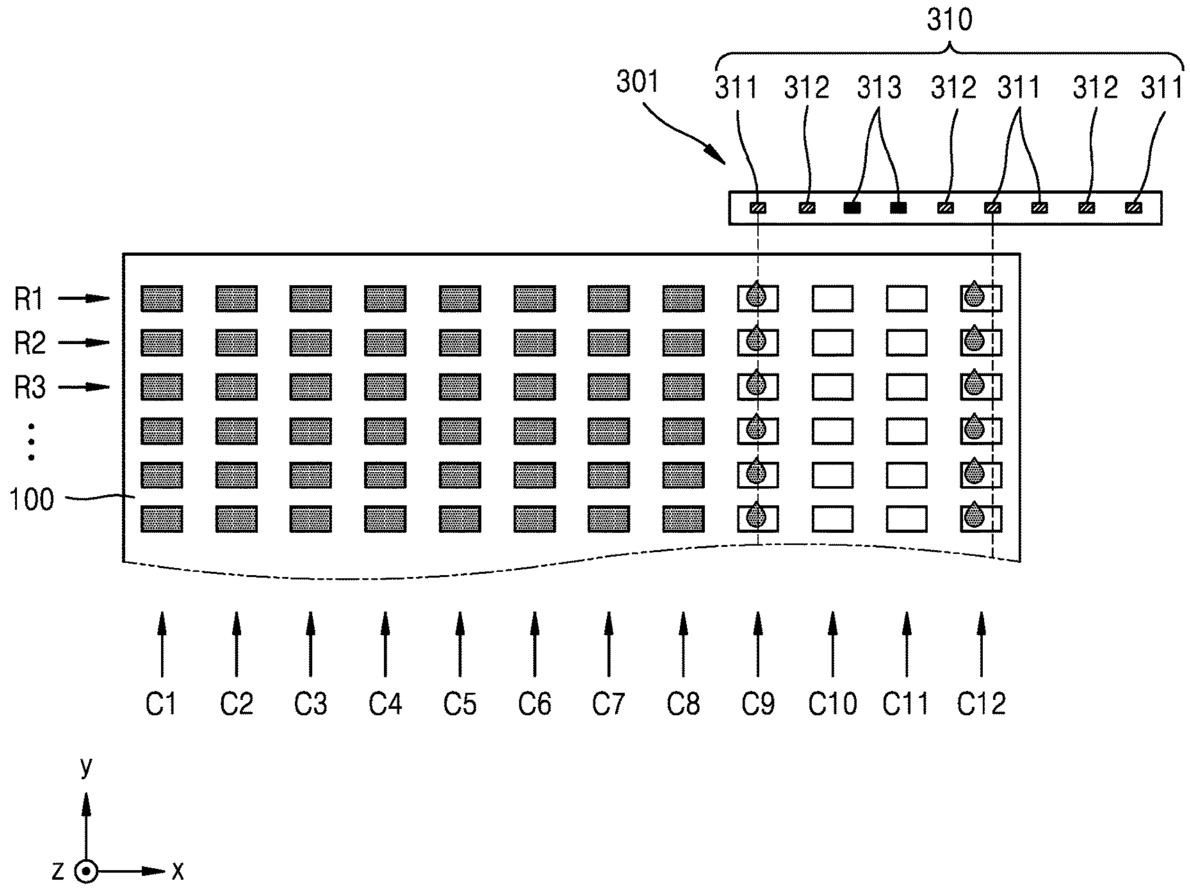

Likewise, as shown in FIG. 5, the first head 301 is arranged such that the leftmost first nozzle 311 from among the plurality of first nozzles 310 corresponds to the leftmost dotting area of the undotted dotting areas from among the plurality of dotting areas arranged on the first row R1. In FIG. 5, the first head 301 is arranged such that the leftmost first nozzle 311 from among the plurality of first nozzles 310 corresponds to a ninth column C9. In this situation, from among the plurality of first nozzles 310 of the first head 301, those corresponding to the undotted dotting areas are identified. In FIG. 5, from among the nine first nozzles 310 included in the first head 301, two first nozzles 311 arranged at the first and sixth positions correspond to the undotted dotting areas. In this state, the first head 301 is relatively moved in the second direction (y-axis direction) with respect to the substrate 100, and the material for forming a red emission layer is dotted on the substrate 100, so that red emission layers are formed by dotting the material for forming a red emission layer on dotting areas arranged on the ninth column C9 and a twelfth column C12.

Figure 6:
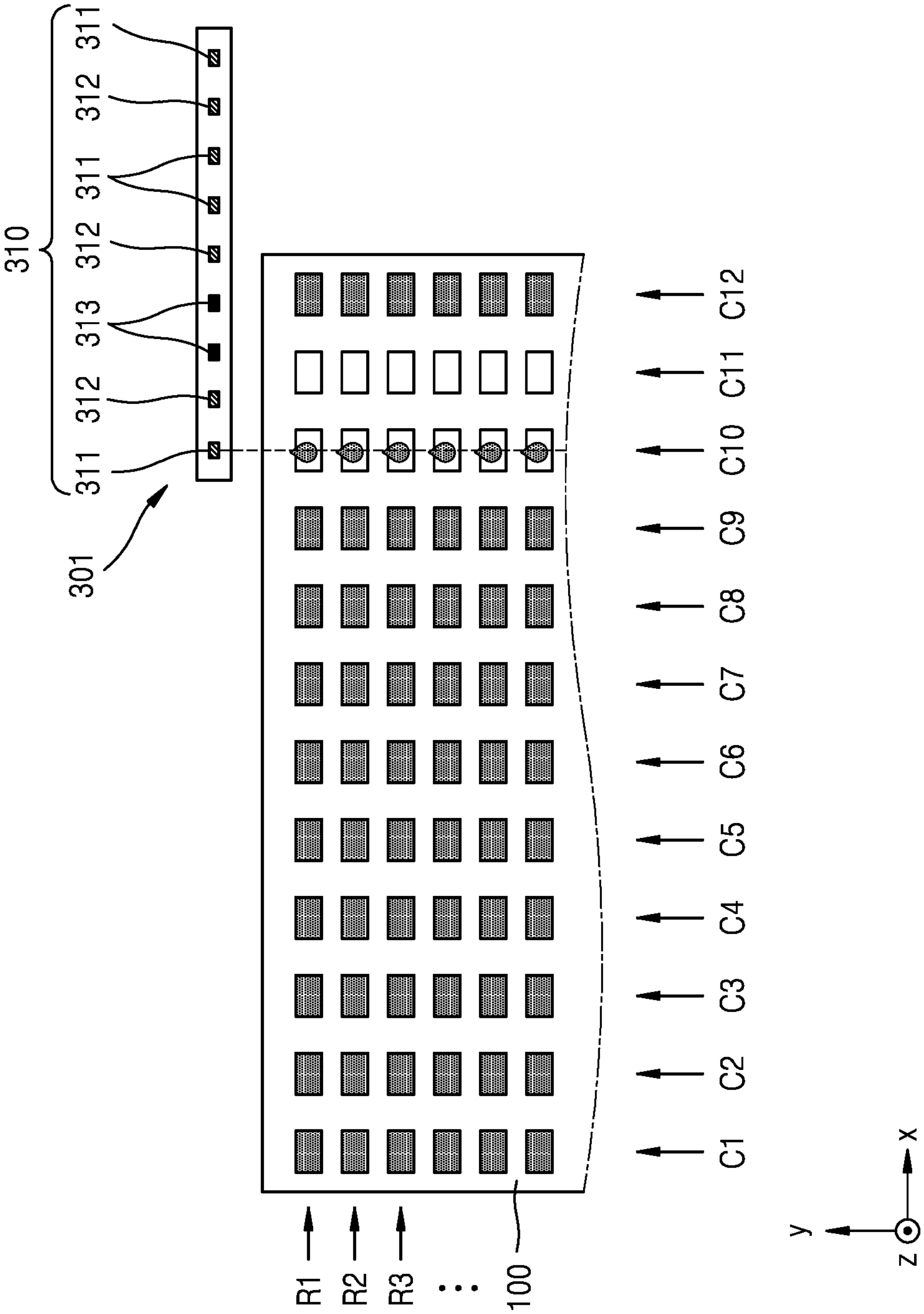
Figure 7:
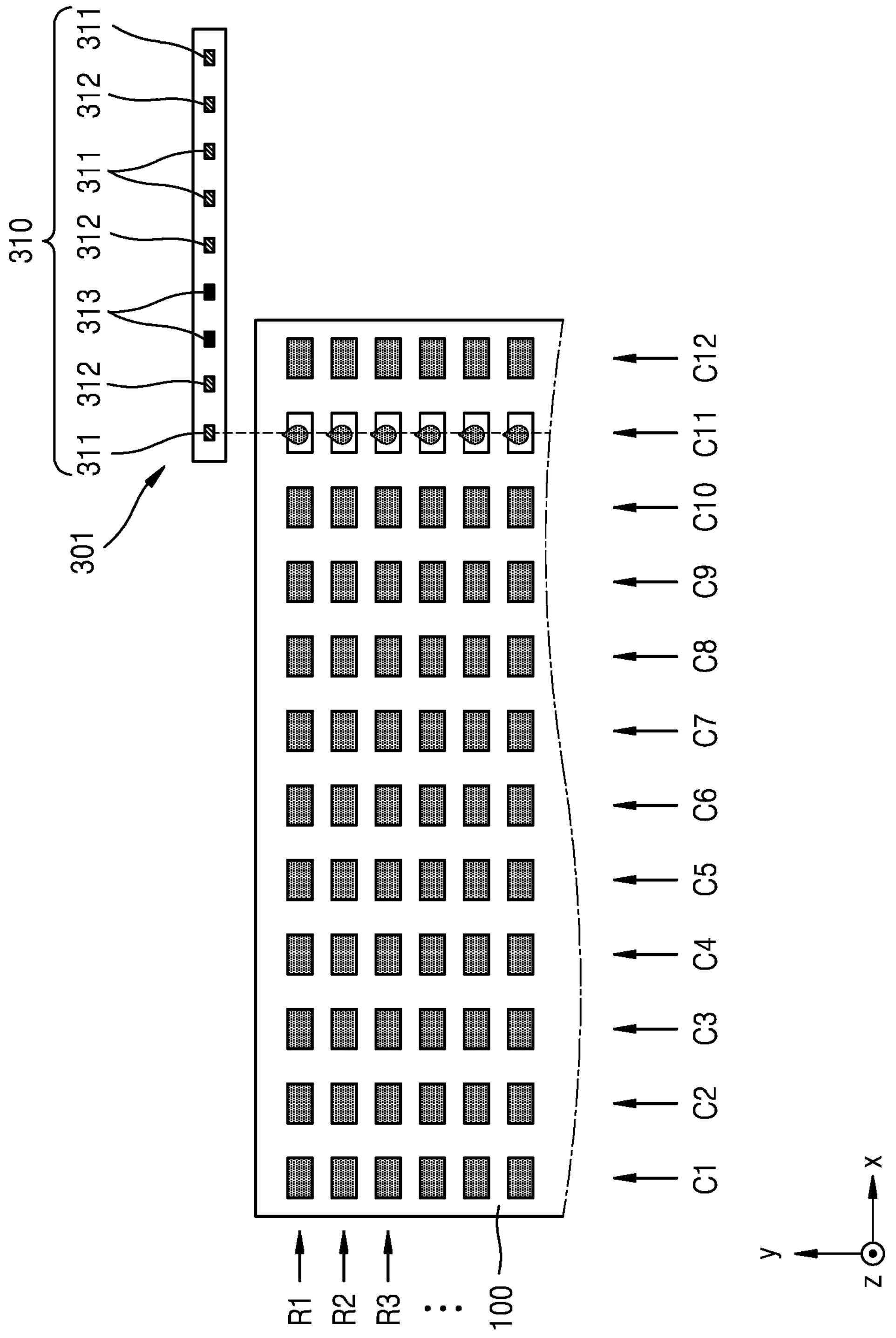

Subsequently, as shown in FIG. 6, the first head 301 is arranged such that the leftmost first nozzle 311 from among the plurality of first nozzles 310 corresponds to the leftmost dotting area of the undotted dotting areas from among the plurality of dotting areas arranged on the first row R1. In FIG. 6, the first head 301 is arranged such that the leftmost first nozzle 311 from among the plurality of first nozzles 310 corresponds to a tenth column C10. In this situation, from among the plurality of first nozzles 310 of the first head 301, those corresponding to the undotted dotting areas are identified. In FIG. 6, from among the nine first nozzles 310 included in the first head 301, the first nozzle 311 arranged at the first position corresponds to the undotted dotting areas. In this state, the first head 301 is relatively moved in the second direction (y-axis direction) with respect to the substrate 100, and the material for forming a red emission layer is dotted on the substrate 100, so that red emission layers are formed by dotting the material for forming a red emission layer on dotting areas arranged on the tenth column C10. Likewise, as shown in FIG. 7, red emission layers are formed by dotting the material for forming a red emission layer on dotting areas arranged on an eleventh column C11.

In the case of the manufacturing method according to the comparative example, through the processes shown in FIGS. 2 to 7, the material for forming a red emission layer may be dotted by changing the position of the first head 301 in the first direction (x-axis direction) five times, thereby forming red emission layers on twelve columns.

In the case of the manufacturing method in the illustrated embodiment, as described above with reference to FIG. 2, red emission layers are formed by dotting the material for forming a red emission layer on the dotting areas arranged on the first column C1, the fourth column C4, the fifth column C5, and the sixth column C6. In addition, the plurality of first nozzles 310 is arranged over one row including a plurality of dotting areas. In an embodiment, the first head 301 may be arranged over the first row R1 arranged uppermost in the second direction (y-axis direction), for example. In this case, from among dotting areas of the first row R1, dotting areas for which corresponding ones of the plurality of first nozzles 310 do not exist are identified as first dotting areas. The plurality of first nozzles 310 may include also the first nozzles 313 that do not operate. Accordingly, from among the dotting areas of the first row R1, those corresponding to the first nozzles 313 that do not operate are considered as dotting areas for which corresponding ones of the plurality of first nozzles 310 do not exist, and thus are identified as belonging to the first dotting areas.

Subsequently, the position of the first head 301 is changed on the first row R1, while the first nozzle 310, from among the plurality of first nozzles 310, corresponding to a leftmost dotting area from among the identified first dotting areas is changed. When the number of dotting areas from among the first dotting areas for which corresponding ones of the plurality of first nozzles 310 exist is maximized, a first nozzle from among the plurality of first nozzles 310 which corresponds to the leftmost dotting area from among the first dotting areas is identified as a first target nozzle.

Figure 8:
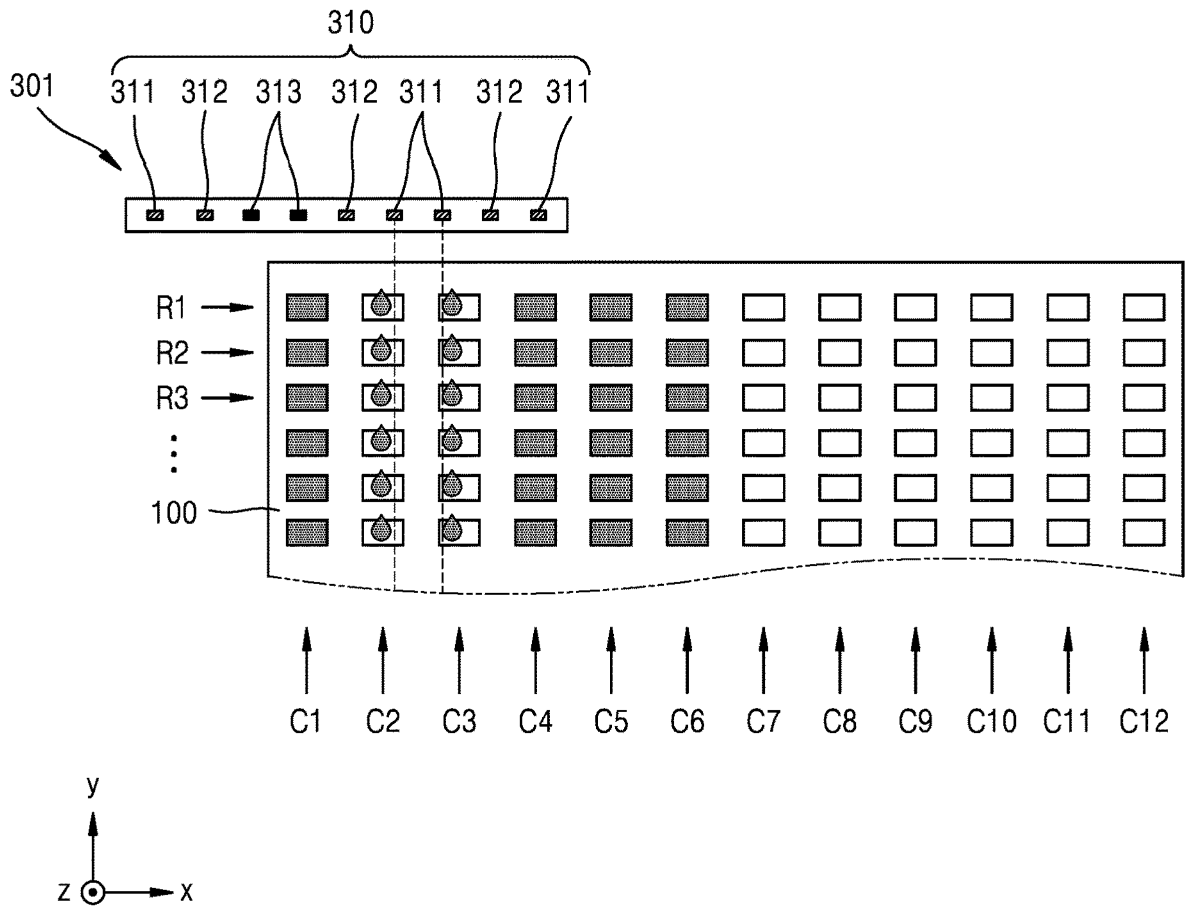
FIGS. 8 to 10 are conceptual views schematically illustrating an embodiment of processes of a method of manufacturing a display apparatus.

In an embodiment shown in FIG. 8, the leftmost dotting area from among the first dotting areas is a dotting area arranged in the second column C2, for example. As shown in FIG. 8, when a sixth first nozzle 311 of the first head 301 is arranged to correspond to the second column C2, dotting areas from among undotted first dotting areas for which corresponding ones of the plurality of first nozzles 310 exist are a dotting area of the second column C2 and a dotting area of the third column C3. Accordingly, as shown in FIG. 8, when the sixth first nozzle 311 of the first head 301 is arranged to correspond to the second column C2, the number of dotting areas from among the undotted first dotting areas for which corresponding ones of the plurality of first nozzles 310 exist becomes two.

In the case described above with reference to FIG. 3, that is, when the first head 301 is arranged such that the leftmost first nozzle 311 from among the plurality of first nozzles 310 corresponds to the leftmost dotting area of the undotted dotting areas from among the plurality of dotting areas arranged on the first row R1, the number of dotting areas from among the undotted first dotting areas for which corresponding ones of the plurality of first nozzles 310 exist becomes two. However, in this case, the material for forming a red emission layer is dotted on the dotting areas arranged on the second column C2 and the seventh column C7, and the material for forming a red emission layer is not dotted on the dotting area arranged on the third column C3. In contrast, in an embodiment shown in FIG. 8, the material for forming a red emission layer may be dotted on the dotting area of the second column C2 and the dotting area of the third column C3. As described above, when the number of dotting areas from among the undotted first dotting areas for which corresponding ones of the plurality of first nozzles 310 exist is the same in two cases, a case where dotting areas arranged relatively on the left (in the −x direction) may be dotted may be preferred. Accordingly, as shown in FIG. 8, the sixth first nozzle 311 of the plurality of first nozzles 310 may be identified as the first target nozzle.

Accordingly, as shown in FIG. 8, the first head 301 is arranged such that the first target nozzle from among the plurality of the first nozzles 310, that is, the sixth first nozzle 311, is arranged over a leftmost dotting area of dotting areas that are not dotted with ink from among the plurality of dotting areas of the first row R1, that is, on the second column C2. In addition, in this state, by, from among the plurality of first nozzles 310, first nozzles corresponding to the dotting areas that are not dotted with ink from among the plurality of dotting areas of the first row R1, ink is dotted while the first head 301 is moved relative to the plurality of dotting areas in the second direction (y-axis direction). As shown in FIG. 8, through this process, the material for forming a red emission layer may be dotted on the dotting areas of the second column C2 and the third column C3.

Subsequently, second dotting areas are identified. In detail, in a state in which the first head 301 is arranged over one row, e.g., the first row R1, such that the first target nozzle corresponds to the leftmost dotting area from among the first dotting areas, dotting areas from among the first dotting areas for which corresponding ones of the plurality of first nozzles 310 do not exist are identified as the second dotting areas. The first dotting areas are areas that are not dotted in the situation shown in FIG. 2, and, from among the first dotting areas, those identified as the second dotting areas are areas that are not dotted even in the situation shown in FIG. 8. In the case of FIG. 8, dotting areas belonging to the seventh column C7 to the twelfth column C12 become the second dotting areas.

Figure 9:
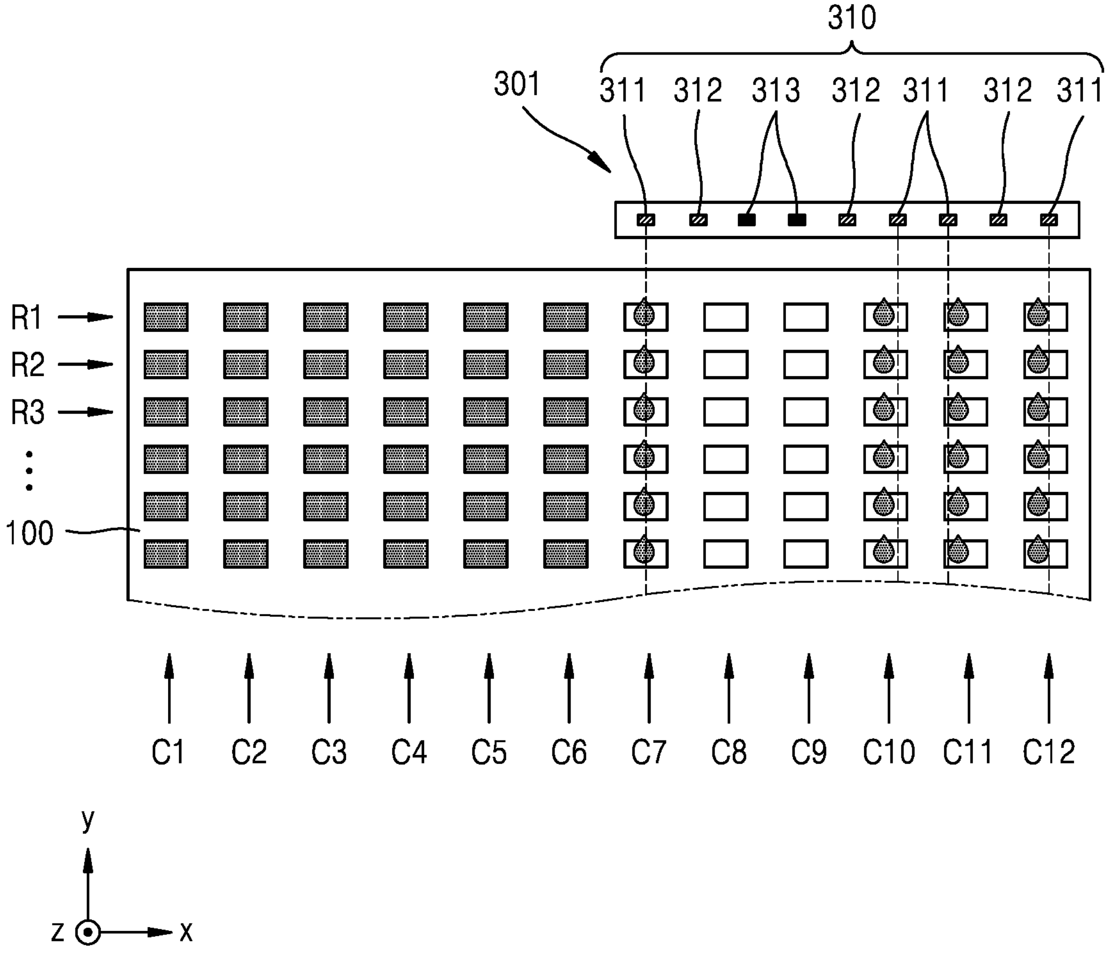

After identifying the second dotting areas, the position of the first head 301 is changed over one row, e.g., the first row R1 arranged uppermost in the second direction (y-axis direction). While the first nozzle 310 corresponding to a leftmost dotting area from among the second dotting areas is changed, when the number of dotting areas from among the second dotting areas for which corresponding ones of the plurality of first nozzles 310 exist is maximized, the first nozzle 310 corresponding to the leftmost dotting area from among the second dotting areas is identified as a second target nozzle. In the case shown in FIG. 8, because the second dotting areas are on the seventh column C7 to the twelfth column C12, as described above, the leftmost dotting area from among the second dotting areas is the dotting area arranged on the seventh column C7. Accordingly, while, from among the first nozzles 310, the first nozzle 310 corresponding to the seventh column C7 is changed, the second target nozzle is identified. As shown in FIG. 9, when a first first nozzle 311 from among the first nozzles 310 corresponds to the seventh column C7, first nozzles 311 corresponding to the seventh column C7, the tenth column C10, the eleventh column C11, and the twelfth column C12 from among the seventh column C7 to the twelfth column C12 exist, and thus, the number of dotting areas from among the second dotting areas for which corresponding ones of the plurality of first nozzles 310 exist becomes four, which is a maximum value. Accordingly, the first first nozzle 311 from among the first nozzles 310 becomes the second target nozzle.

Accordingly, the first head 301 is arranged such that the first first nozzle 311, which is the second target nozzle, is arranged over the seventh column C7 on which the leftmost dotting area from among the second dotting areas is disposed. In addition, in this state, the first head 301 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the seventh column C7, the tenth column C10, the eleventh column C11, and the twelfth column C12.

Subsequently, the process of identifying the second dotting areas as described above with reference to FIG. 8 and the process of identifying the second target nozzle as described above with reference to FIG. 9 are repeated, so that red emission layers are formed by dotting the material for forming a red emission layer.

In an embodiment, third dotting areas are identified in the situation as shown in FIG. 9, for example. In detail, in a state in which the first head 301 is arranged over one row, e.g., the first row R1, such that the second target nozzle corresponds to the leftmost dotting area from among the second dotting areas, dotting areas from among the second dotting areas for which corresponding ones of the plurality of first nozzles 310 do not exist are identified as the third dotting areas. The second dotting areas are areas that are not dotted in the situation shown in FIG. 8, and, from among the second dotting areas, those identified as the third dotting areas are areas that are not dotted even in the situation shown in FIG. 9. In the case of FIG. 9, dotting areas belonging to the eighth column C8 and the ninth column C9 become the third dotting areas.

Figure 10:
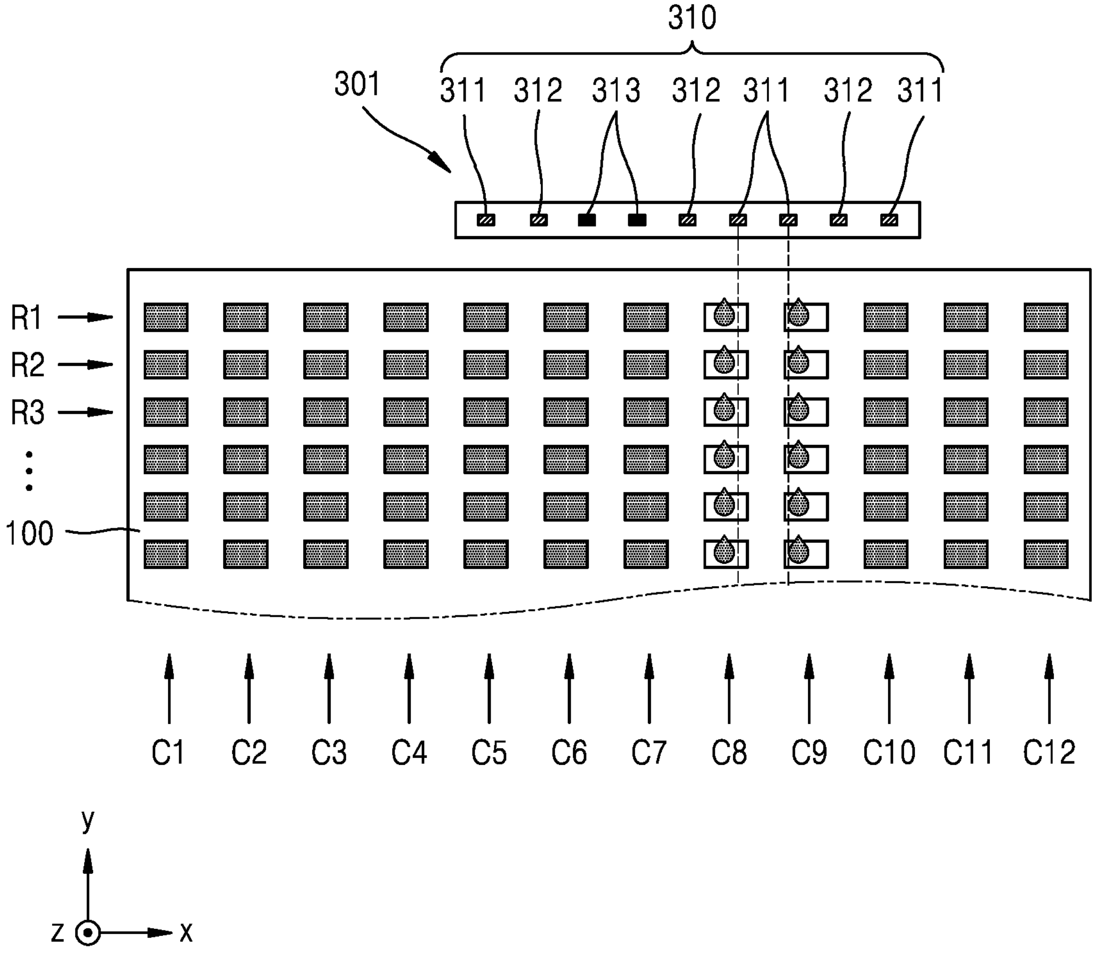

After identifying the third dotting areas, the position of the first head 301 is changed over one row, e.g., the first row R1 arranged uppermost in the second direction (y-axis direction). While the first nozzle 310 corresponding to a leftmost dotting area from among the third dotting areas is changed, when the number of dotting areas from among the third dotting areas for which corresponding ones of the plurality of first nozzles 310 exist is maximized, the first nozzle 310 corresponding to the leftmost dotting area from among the third dotting areas is identified as a third target nozzle. In the case shown in FIG. 9, because the third dotting areas are on the eighth column C8 and the ninth column C9, as described above, the leftmost dotting area from among the third dotting areas is the dotting area arranged on the eighth column C8. Accordingly, the first nozzle 310 corresponding to the eighth column C8 from among the first nozzles 310 is changed, and the third target nozzle is identified. As shown in FIG. 10, when the sixth first nozzle 311 from among the first nozzles 310 corresponds to the eighth column C8, first nozzles 311 corresponding to both the eighth column C8 and the ninth column C9 exist, and thus, the number of dotting areas from among the third dotting areas for which corresponding ones of the plurality of first nozzles 310 exist becomes two, which is a maximum value. Accordingly, the sixth first nozzle 311 from among the first nozzles 310 becomes the third target nozzle.

Accordingly, the first head 301 is arranged such that the sixth first nozzle 311, which is the third target nozzle, is arranged over the eighth column C8 on which the leftmost dotting area from among the third dotting areas is disposed. In addition, in this state, the first head 301 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the eighth column C8 and the ninth column C9.

As described above, in the case of the manufacturing method according to the comparative example, through the processes shown in FIGS. 2 to 7, the material for forming a red emission layer may be dotted by changing the position of the first head 301 in the first direction (x-axis direction) five times, thereby forming red emission layers on twelve columns. However, in the case of the manufacturing method in the illustrated embodiment, through the processes shown in FIGS. 2 and 8 to 10, the material for forming a red emission layer may be dotted by changing the position of the first head 301 in the first direction (x-axis direction) three times, thereby forming red emission layers on twelve columns. Accordingly, a display apparatus may be efficiently manufactured in a relatively short time.

It is not desired to perform the identifying of the first target nozzle, the second target nozzle, and/or the third target nozzle and the identifying of the first dotting area, the second dotting area, and/or the third dotting area each time a display apparatus is manufactured. When the size, resolution, or the like of a display apparatus to be manufactured is determined in a state in which the first head 301 is prepared, the first target nozzle, the second target nozzle, and/or the third target nozzle and the first dotting area, the second dotting area, and/or the third dotting area are identified. Thereafter, as long as the size and/or the resolution of the display apparatus to be manufactured is not changed, the display apparatus is manufactured using the first target nozzle, the second target nozzle, and/or the third target nozzle and the first dotting area, the second dotting area, and/or the third dotting area as previously identified, while minimizing a change in the position of the first head 301. Accordingly, in addition to the method of manufacturing a display apparatus as described above, a method of setting inkjet printing, in which the first target nozzle, the second target nozzle, and/or the third target nozzle and the first dotting area, the second dotting area, and/or the third dotting area are identified, is also within the scope of the disclosure.

Figure 11:
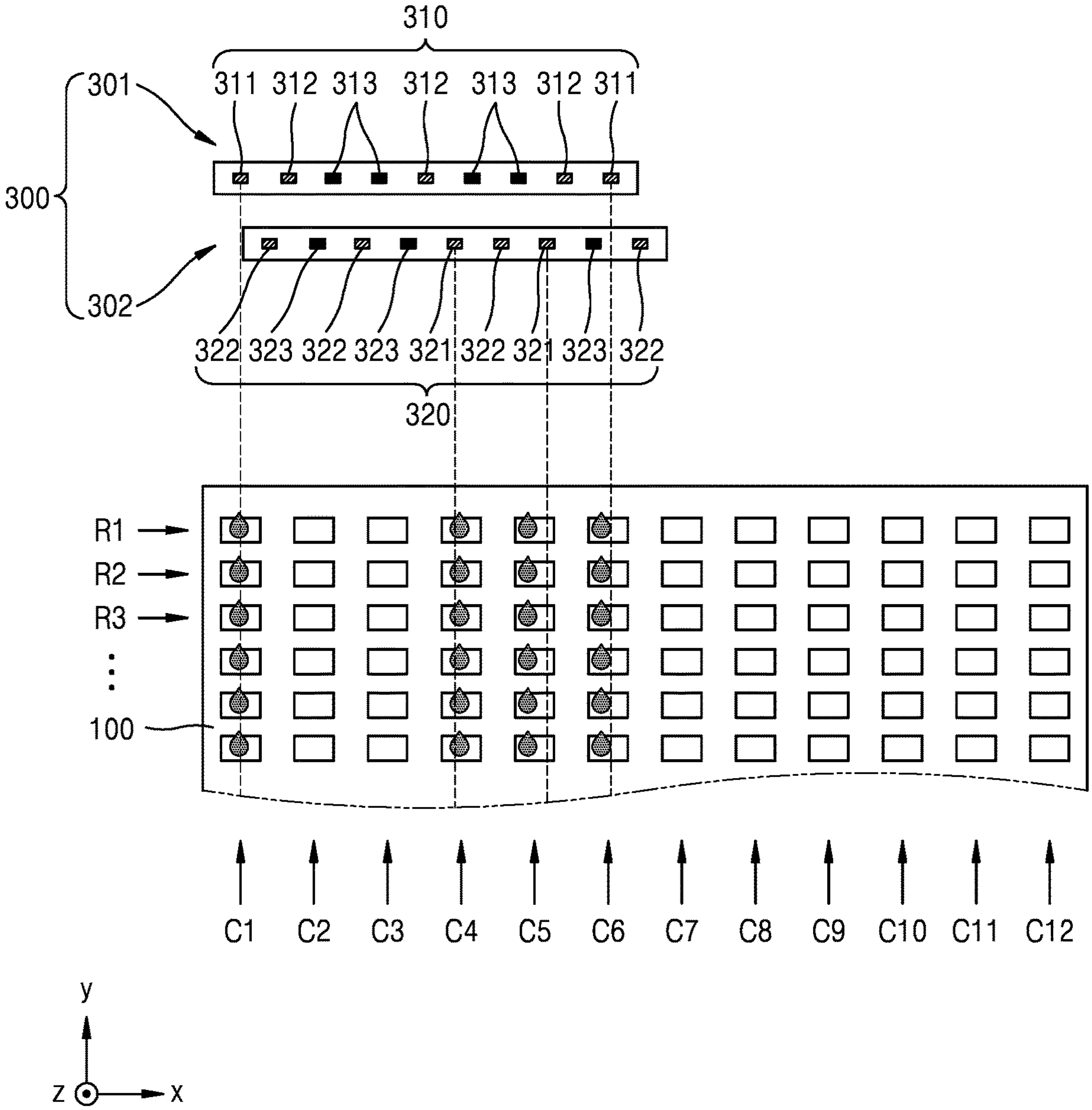
FIGS. 11 to 14 are conceptual views schematically illustrating an embodiment of processes of a method of manufacturing a display apparatus.

Hereinbefore, a method of setting inkjet printing and a method of manufacturing a display apparatus by the same have been described with respect to the case of using the first head 301, but the disclosure is not limited thereto. As shown in FIG. 11, which is a conceptual view schematically illustrating a process of a method of manufacturing a display apparatus in an embodiment, a headset 300 including a plurality of heads may be used, for example. In FIG. 11, the headset 300 includes the first head 301 and a second head 302.

The first head 301 included in the headset 300 includes a plurality of first nozzles 310 arranged in the first direction (x-axis direction), and similarly, the second head 302 included in the headset 300 includes a plurality of second nozzles 320 arranged in the first direction (x-axis direction). The first nozzles 310 of the first head 301 may be arranged to be misaligned with the second nozzles 320 of the second head 302. In FIG. 11, a leftmost first nozzle of the first head 301 is arranged relatively farther to the left than a leftmost second nozzle of the second head 302.

The headset 300 is arranged such that the plurality of first nozzles 310 is arranged over one row including a plurality of dotting areas, and a leftmost first nozzle 311 from among the plurality of first nozzles 310 corresponds to a leftmost dotting area from among the plurality of dotting areas arranged on the one row, that is, the leftmost first nozzle 311 from among the plurality of first nozzles 310 corresponds to the dotting area of the first column C1.

The plurality of first nozzles 310 may include the first nozzles 313 that do not operate. Accordingly, the term "leftmost first nozzle from among the plurality of first nozzles 310" refers to a leftmost first nozzle from among operating nozzles of the plurality of first nozzles 310. Similarly, the plurality of second nozzles 320 may include second nozzles 323 that do not operate.

Even when the standard or the like of a display apparatus to be manufactured is changed, the configuration of the headset 300 used for inkjet printing in the manufacture of the display apparatus is not changed. Accordingly, even when the headset 300 is arranged over a plurality of dotting areas, the first nozzles 310 and the second nozzles 320 of the first head 301 and the second head 302 included in the headset 300 may not correspond to the plurality of dotting areas on a one-to-one basis.

In FIG. 11, the plurality of first nozzles 310 of the first head 301 includes first nozzles 311 corresponding to the dotting areas and first nozzles 312 not corresponding to the dotting areas. Similarly, the plurality of second nozzles 320 of the second head 302 in FIG. 11 includes second nozzles 321 corresponding to the dotting areas and second nozzles 322 not corresponding to the dotting areas.

In addition, in FIG. 11, the plurality of first nozzles 310 includes the first nozzles 313 that do not operate due to a failure, and the plurality of second nozzles 320 includes the second nozzles 323 that do not operate due to a failure. When there are first nozzles or second nozzles that correspond to the dotting areas but do not operate due to a failure, those first nozzles or second nozzles are not considered as belonging to the first nozzles 311 or the second nozzles 321 corresponding to the dotting areas. Accordingly, in FIG. 11, from among nine first nozzles 310 included in the first head 301, two first nozzles 311 arranged at the first and ninth positions correspond to the dotting areas arranged on the first column C1 and the sixth column C6, and, from among nine second nozzles 320 included in the second head 302, two second nozzles 321 arranged at fifth and seventh positions correspond to the dotting areas arranged on the fourth column C4 and the fifth column C5.

In this state, the headset 300 is relatively moved in the second direction (y-axis direction) with respect to the substrate 100, and a material for forming a red emission layer is dotted on the substrate 100, so that red emission layers are formed by dotting the material for forming a red emission layer on the dotting areas arranged on the first column C1, the fourth column C4, the fifth column C5, and the sixth column C6.

In addition, in a state in which the headset 300 is arranged as shown in FIG. 11, from among dotting areas of one row, e.g., dotting areas of the first row R1 arranged uppermost in the second direction (y-axis direction), dotting areas for which corresponding ones of the plurality of first nozzles 310 or the plurality of second nozzles 320 do not exist are identified as first dotting areas. The plurality of first nozzles 310 may include the first nozzles 313 that do not operate. Accordingly, from among the dotting areas of the first row R1, those corresponding to the first nozzles 313 that do not operate are considered as dotting areas for which corresponding ones of the plurality of first nozzles 310 do not exist, and thus are identified as belonging to the first dotting areas. The same applies to the second nozzles 320.

Subsequently, the position of the headset 300 is changed over the first row R1, while the first nozzle 310 or the second nozzle 320 corresponding to a leftmost dotting area from among the identified first dotting areas is changed. When the number of dotting areas from among the first dotting areas for which corresponding ones of the plurality of first nozzles 310 or the plurality of second nozzles 320 exist is maximized, a first nozzle or a second nozzle corresponding to the leftmost dotting area from among the first dotting areas is identified as a first target nozzle.

Figure 12:
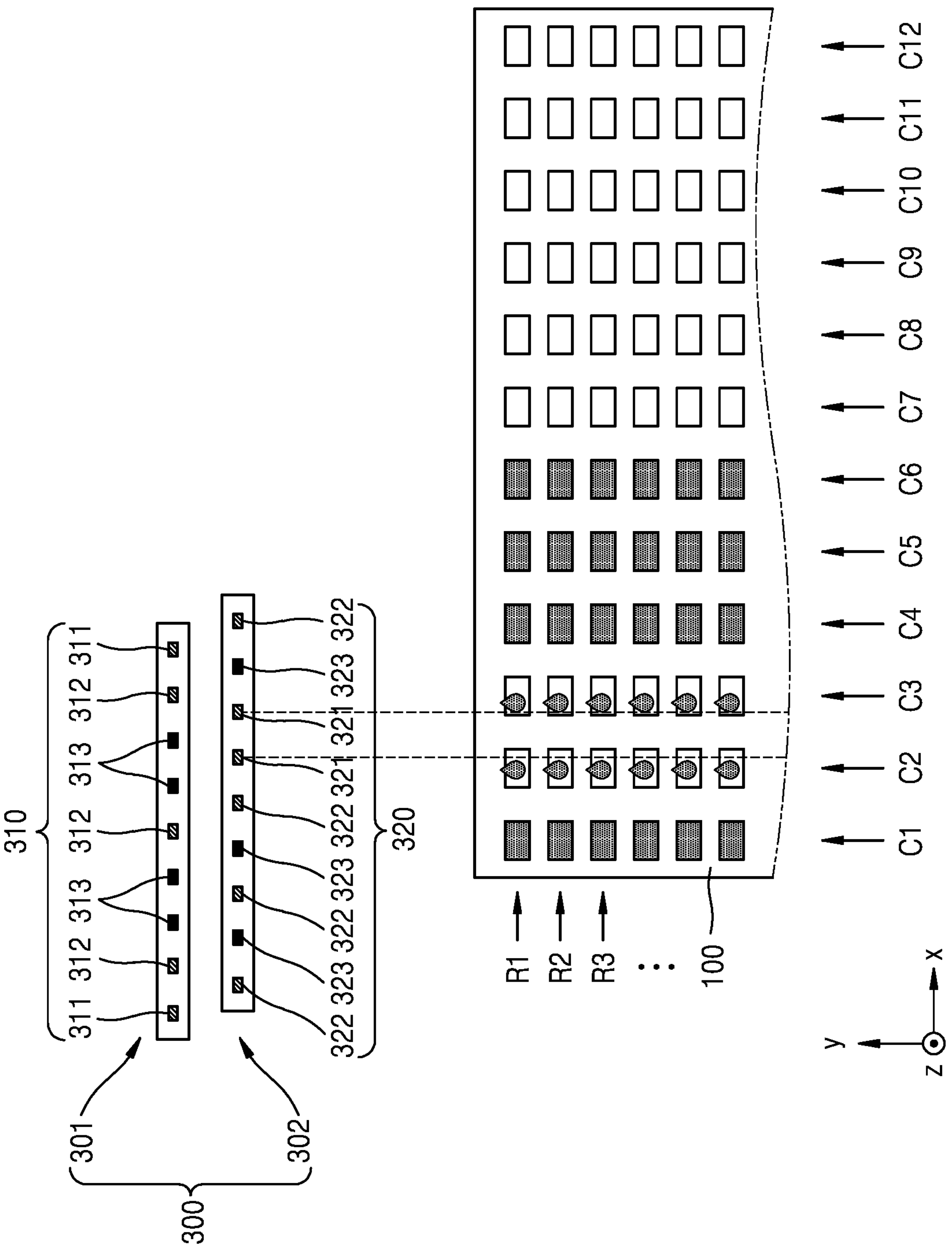

In an embodiment shown in FIG. 11, the leftmost dotting area from among the first dotting areas is a dotting area arranged on the second column C2, for example. Accordingly, as shown in FIG. 12, when a sixth second nozzle 321 of the second head 302 included in the headset 300 is arranged to correspond to the second column C2, the number of dotting areas from among undotted first dotting areas for which corresponding ones of the plurality of first nozzles 310 or the plurality of second nozzles 320 exist becomes two, which is a maximum value. Accordingly, the sixth second nozzle 321 of the second head 302 included in the headset 300 is identified as the first target nozzle.

Likewise, when the headset 300 is arranged in another way, the number of dotting areas from among the undotted first dotting areas for which corresponding ones of the plurality of first nozzles 310 or the plurality of second nozzles 320 exist may be two. As described above, when the number of dotting areas from among the undotted first dotting areas for which corresponding ones of the plurality of first nozzles 310 or the plurality of second nozzles 320 exist is the same in two cases, a case where dotting areas arranged relatively on the left (in the −x direction) are dotted may be preferred. Accordingly, as shown in FIG. 12, the sixth second nozzle 321 of the second head 302 included in the headset 300 may be identified as the first target nozzle.

Accordingly, as shown in FIG. 12, the headset 300 is arranged such that the first target nozzle from among the plurality of first nozzles 310 and the plurality of second nozzles 320, that is, the sixth second nozzle 321 of the second head 302, is arranged over a leftmost dotting area of dotting areas that are not dotted with ink from among the plurality of dotting areas of the first row R1, that is, on the second column C2. In addition, in this state, by the sixth second nozzle 321 and a seventh second nozzle 321 of the second head 302, ink is dotted while the headset 300 is moved relative to the plurality of dotting areas in the second direction (y-axis direction). As shown in FIG. 12, through this process, the material for forming a red emission layer may be dotted on the dotting areas of the second column C2 and the third column C3.

Subsequently, second dotting areas are identified. In detail, in a state in which the headset 300 is arranged over one row, e.g., the first row R1, such that the first target nozzle corresponds to the leftmost dotting area from among the first dotting areas, dotting areas from among the first dotting areas for which corresponding ones of the plurality of first nozzles 310 and the plurality of second nozzles 320 do not exist are identified as the second dotting areas. The first dotting areas are areas that are not dotted in the situation shown in FIG. 11, and, from among the first dotting areas, those identified as the second dotting areas are areas that are not dotted even in the situation shown in FIG. 12. In the case of FIG. 12, dotting areas belonging to the seventh column C7 to the twelfth column C12 become the second dotting areas.

Figure 13:
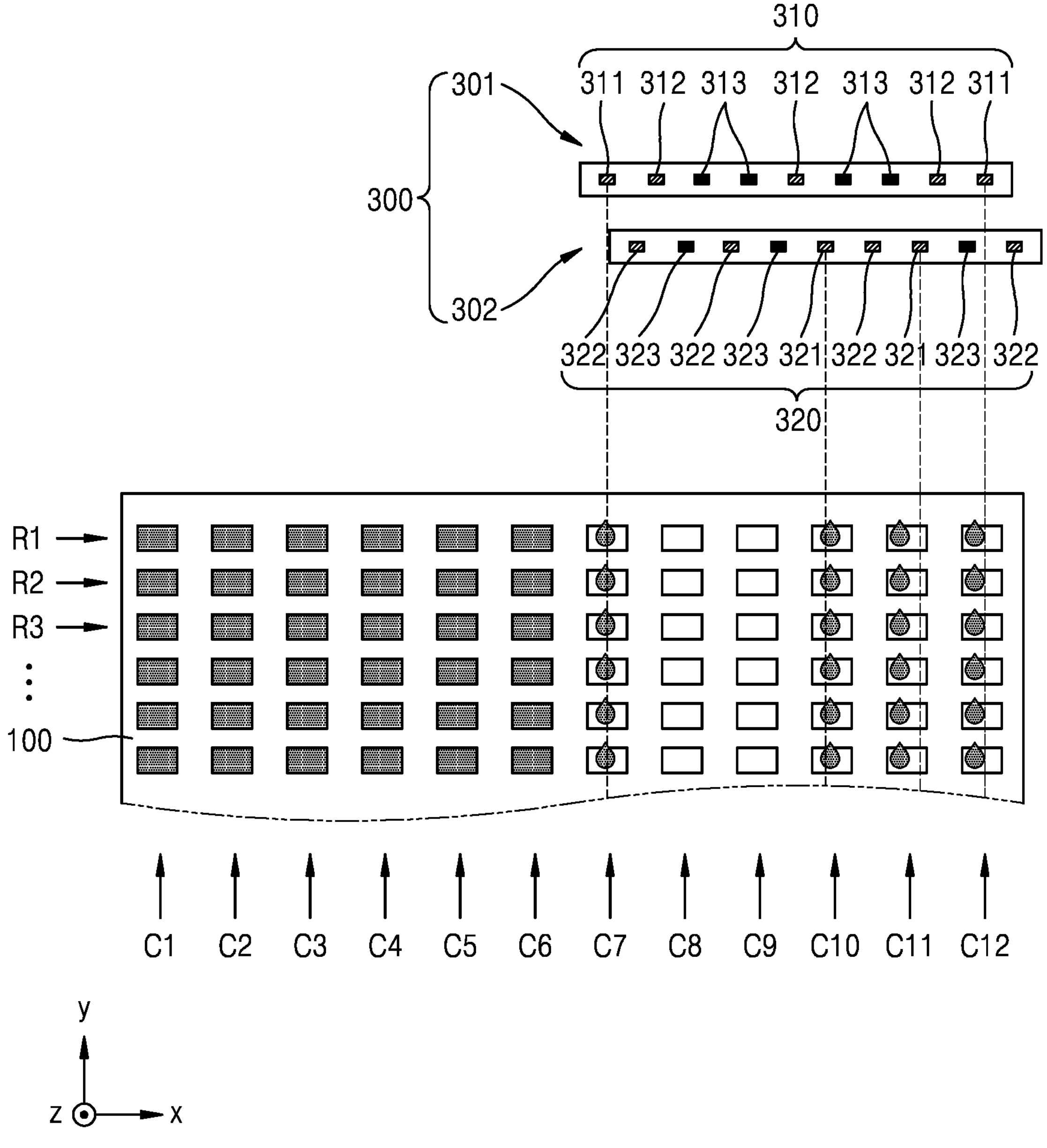

After identifying the second dotting areas, the position of the headset 300 is changed over one row, e.g., the first row R1 arranged uppermost in the second direction (y-axis direction). While the first nozzle 310 or the second nozzle 320 corresponding to a leftmost dotting area from among the second dotting areas is changed, when the number of dotting areas from among the second dotting areas for which corresponding ones of the plurality of first nozzles 310 and the plurality of second nozzles 320 exist is maximized, the first nozzle 310 or the second nozzle 320 corresponding to the leftmost dotting area from among the second dotting areas is identified as a second target nozzle. In the case shown in FIG. 12, because the second dotting areas are on the seventh column C7 to the twelfth column C12, as described above, the leftmost dotting area from among the second dotting areas is the dotting area arranged on the seventh column C7. Accordingly, from among the first nozzles 310 and the second nozzles 320, the first nozzle 310 or the second nozzle 320 corresponding to the seventh column C7 is changed, and the second target nozzle is identified. As shown in FIG. 13, when the first first nozzle 311 from among the first nozzles 310 corresponds to the seventh column C7, first nozzles 311 or second nozzles 321 corresponding to the seventh column C7, the tenth column C10, the eleventh column C11, and the twelfth column C12 from among the seventh column C7 to the twelfth column C12 exist, and thus, the number of dotting areas from among the second dotting areas for which corresponding ones of the plurality of first nozzles 310 and the plurality of second nozzles 320 exist becomes four, which is a maximum value. Accordingly, the first first nozzle 311 from among the first nozzles 310 becomes the second target nozzle.

Accordingly, the headset 300 is arranged such that the first first nozzle 311 from among the first nozzles 310, which is the second target nozzle, is arranged over the seventh column C7 on which the leftmost dotting area from among the second dotting areas is disposed. In addition, in this state, the headset 300 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the seventh column C7, the tenth column C10, the eleventh column C11, and the twelfth column C12.

Subsequently, the process of identifying the second dotting areas as described above with reference to FIG. 12 and the process of identifying the second target nozzle as described above with reference to FIG. 13 are repeated, so that red emission layers are formed by dotting the material for forming a red emission layer.

In an embodiment, third dotting areas are identified in the situation as shown in FIG. 13, for example. In detail, in a state in which the headset 300 is arranged over one row, e.g., the first row R1, such that the second target nozzle corresponds to the leftmost dotting area from among the second dotting areas, dotting areas from among the second dotting areas for which corresponding ones of the plurality of first nozzles 310 and the plurality of second nozzles 320 do not exist are identified as the third dotting areas. The second dotting areas are areas that are not dotted in the situation shown in FIG. 12, and, from among the second dotting areas, those identified as the third dotting areas are areas that are not dotted even in the situation shown in FIG. 13. In the case of FIG. 13, dotting areas belonging to the eighth column C8 and the ninth column C9 become the third dotting areas.

Figure 14:
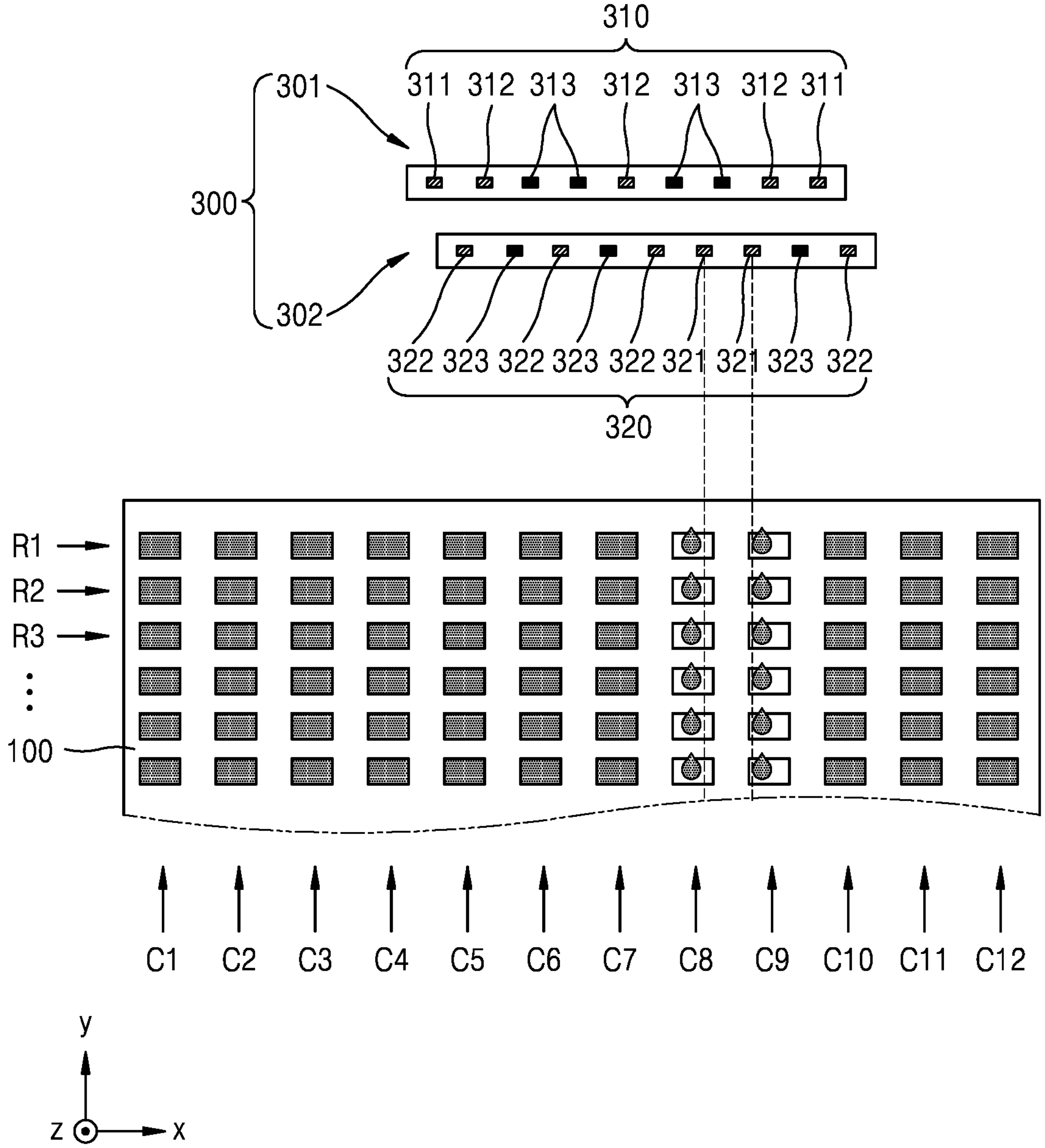

After identifying the third dotting areas, the position of the headset 300 is changed over one row, e.g., the first row R1 arranged uppermost in the second direction (y-axis direction). While the first nozzle 310 or the second nozzle 320 corresponding to a leftmost dotting area from among the third dotting areas is changed, when the number of dotting areas from among the third dotting areas for which corresponding ones of the plurality of first nozzles 310 and the plurality of second nozzles 320 exist is maximized, the first nozzle 310 or the second nozzle 320 corresponding to the leftmost dotting area from among the third dotting areas is identified as a third target nozzle. In the case shown in FIG. 13, because the third dotting areas are on the eighth column C8 and the ninth column C9, as described above, the leftmost dotting area from among the third dotting areas is the dotting area arranged on the eighth column C8. Accordingly, the first nozzle 310 corresponding to the eighth column C8 from among the first nozzles 310 is changed, and the third target nozzle is identified. As shown in FIG. 14, when the sixth second nozzle 321 from among the second nozzles 320 corresponds to the eighth column C8, second nozzles 321 corresponding to both the eighth column C8 and the ninth column C9 exist, and thus, the number of dotting areas from among the third dotting areas for which corresponding ones of the plurality of first nozzles 310 and the plurality of second nozzles 320 exist becomes two, which is a maximum value. Accordingly, the sixth second nozzle 321 from among the second nozzles 320 becomes the third target nozzle.

Accordingly, the headset 300 is arranged such that the sixth second nozzle 321, which is the third target nozzle, is arranged over the eighth column C8 on which the leftmost dotting area from among the third dotting areas is disposed. In addition, in this state, the headset 300 is relatively moved in the second direction (y-axis direction) with respect to the substrate 100, and the material for forming a red emission layer is dotted on the substrate 100, so that red emission layers are formed by dotting the material for forming a red emission layer on dotting areas arranged on the eighth column C8 and the ninth column C9.

In the case of the manufacturing method in the illustrated embodiment, through the processes shown in FIGS. 11 to 14, the material for forming a red emission layer may be dotted by changing the position of the headset 300 in the first direction (x-axis direction) only three times, thereby forming red emission layers on twelve columns. Accordingly, a display apparatus may be efficiently manufactured in a relatively short time.

It is not desired to perform the identifying of the first target nozzle, the second target nozzle, and/or the third target nozzle and the identifying of the first dotting area, the second dotting area, and/or the third dotting area each time a display apparatus is manufactured. When the size, resolution, or the like of a display apparatus to be manufactured is determined in a state in which the headset 300 is prepared, the first target nozzle, the second target nozzle, and/or the third target nozzle and the first dotting area, the second dotting area, and/or the third dotting area are identified. Thereafter, as long as the size and/or the resolution of the display apparatus to be manufactured is not changed, the display apparatus is manufactured using the first target nozzle, the second target nozzle, and/or the third target nozzle and the first dotting area, the second dotting area, and/or the third dotting area as previously identified, while minimizing a change in the position of the headset 300. Accordingly, in addition to the method of manufacturing a display apparatus as described above, a method of setting inkjet printing, in which the first target nozzle, the second target nozzle, and/or the third target nozzle and the first dotting area, the second dotting area, and/or the third dotting area are identified, is also within the scope of the disclosure.

Figure 15:
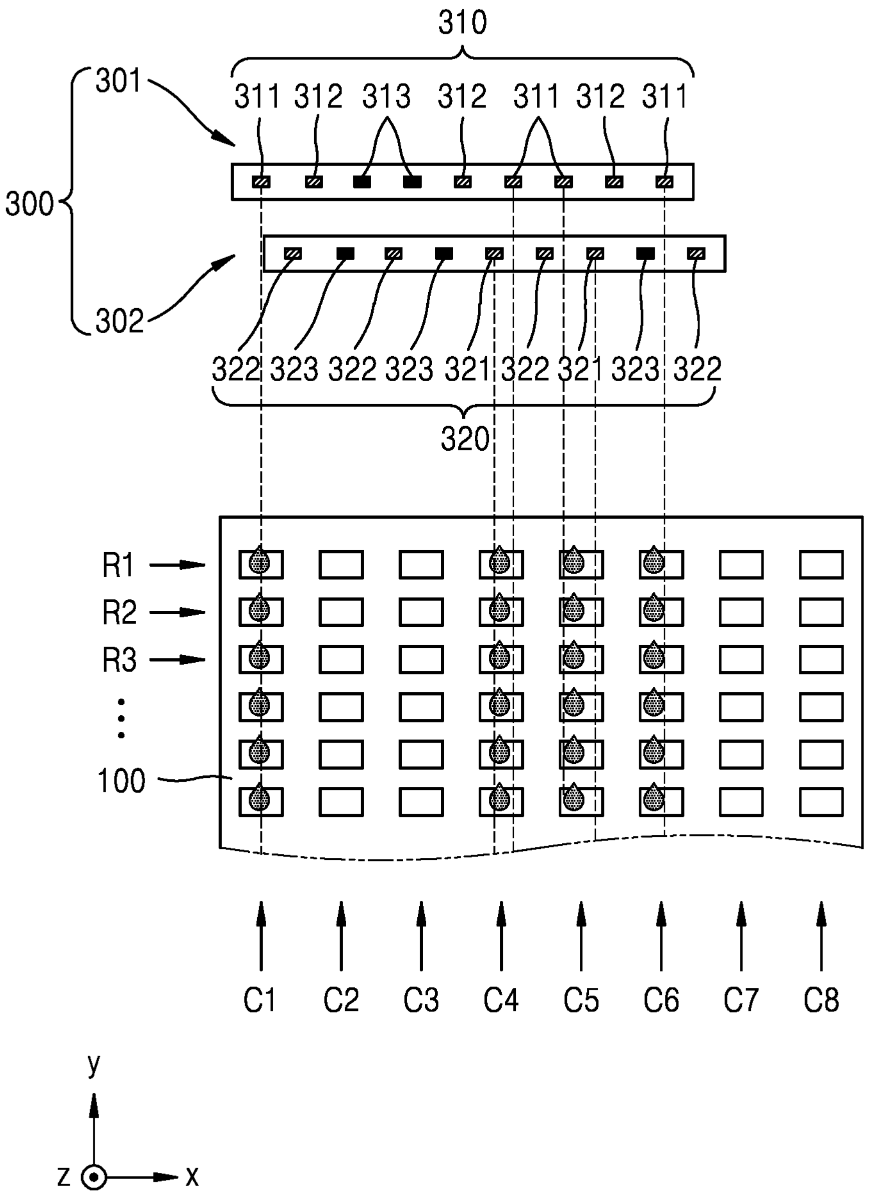
FIGS. 15 and 16 are conceptual views for describing an embodiment of a method of manufacturing a display apparatus.
Figure 16:
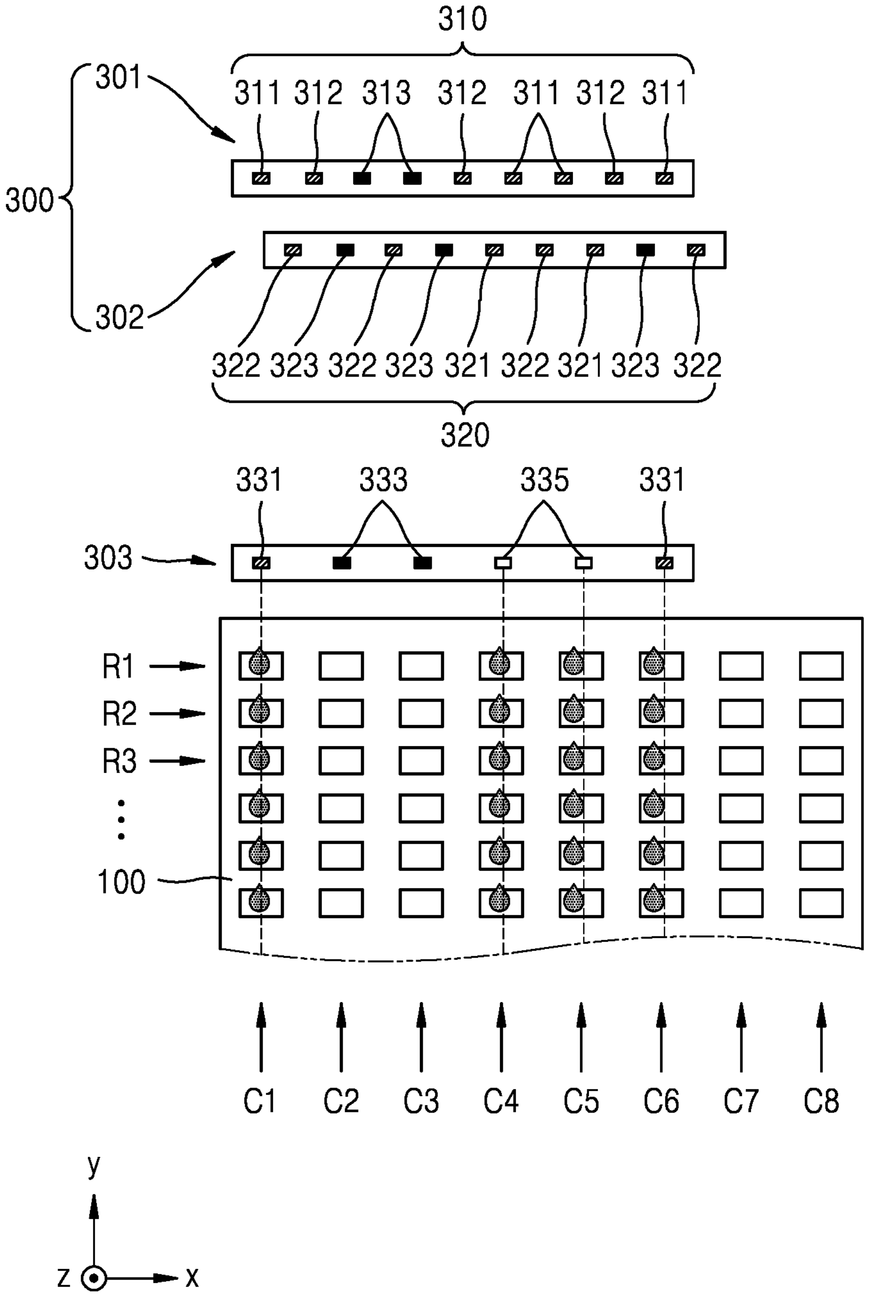

FIGS. 15 and 16 are conceptual views for describing an embodiment of a method of manufacturing a display apparatus. The headset 300 shown in FIG. 15 is basically the same as the headset 300 described above with reference to FIG. 11. The headset 300 shown in FIG. 15 is different from the headset 300 shown in FIG. 11 in terms of the number of the first nozzles 313 that do not operate from among the plurality of first nozzles 310 included in the first head 301.

The headset 300 is arranged such that the plurality of first nozzles 310 is arranged over one row including a plurality of dotting areas, and a leftmost first nozzle 311 from among the plurality of first nozzles 310 corresponds to a leftmost dotting area from among the plurality of dotting areas arranged on the one row, that is, the leftmost first nozzle 311 from among the plurality of first nozzles 310 corresponds to the dotting area of the first column C1.

The plurality of first nozzles 310 may include the first nozzles 313 that do not operate. Accordingly, the term "leftmost first nozzle from among the plurality of first nozzles 310" refers to a leftmost first nozzle from among operating nozzles of the plurality of first nozzles 310. Similarly, the plurality of second nozzles 320 may include the second nozzles 323 that do not operate.

Even when the standard or the like of a display apparatus to be manufactured is changed, the configuration of the headset 300 used for inkjet printing in the manufacture of the display apparatus is not changed. Accordingly, even when the headset 300 is arranged over a plurality of dotting areas, the first nozzles 310 and the second nozzles 320 of the first head 301 and the second head 302 included in the headset 300 may not correspond to the plurality of dotting areas on a one-to-one basis.

As described above, the headset 300 shown in FIG. 15 is different from the headset 300 shown in FIG. 11 in terms of the number of the first nozzles 313 that do not operate from among the plurality of first nozzles 310 included in the first head 301. Accordingly, as shown in FIG. 15, each of the fourth column C4 and the fifth column C5 corresponds to the first nozzle 311 and the second nozzle 321 at the same time.

Depending on the size, resolution, or the like of the display apparatus, it may be desired that a material for forming an emission layer, which is used to form an emission layer of one pixel, is dotted multiple times instead of once. Hereinafter, a case where the material for forming an emission layer, which is used to form an emission layer of one pixel, is dotted two times is described.

As shown in FIG. 15, the first first nozzle 311 from among the first nozzles 310 corresponds to the first column C1, the sixth first nozzle 311 from among the first nozzles 310 and a fifth second nozzle 321 from among the second nozzles 320 correspond to the fourth column C4, a seventh first nozzle 311 from among the first nozzles 310 and a seventh second nozzle 321 from among the second nozzles 320 correspond to the fifth column C5, and a ninth first nozzle 311 from among the first nozzles 310 corresponds to the sixth column C6. In consideration of the correspondence relationships described above, it may be possible to consider a virtual third head 303 as shown in FIG.

G. 16. The virtual third head 303 has six third nozzles corresponding to the first column C1 to the sixth column C6. The third nozzles include two third nozzles 331 corresponding to the first column C1 and the sixth column C6, two third nozzles 335 corresponding to the fourth column C4 and the fifth column C5, and two third nozzles 333 corresponding to the second column C2 and the third column C3. The third nozzles 333 are nozzles that do not operate due to a failure, the third nozzles 331 are nozzles that perform dotting once at a time, and the third nozzles 335 are nozzles that perform dotting twice at a time.

In this state, the headset 300 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the first column C1, the fourth column C4, the fifth column C5, and the sixth column C6. In this case, dotting is performed twice at a time on the fourth column C4 and the fifth column C5, thereby completing the formation of red emission layers. However, dotting is performed only once at a time on the first column C1 and the sixth column C6, and thus, it is desired to perform additional dotting thereon. Therefore, printing is performed two times on the first column C1 and the sixth column C6.

Figure 17:
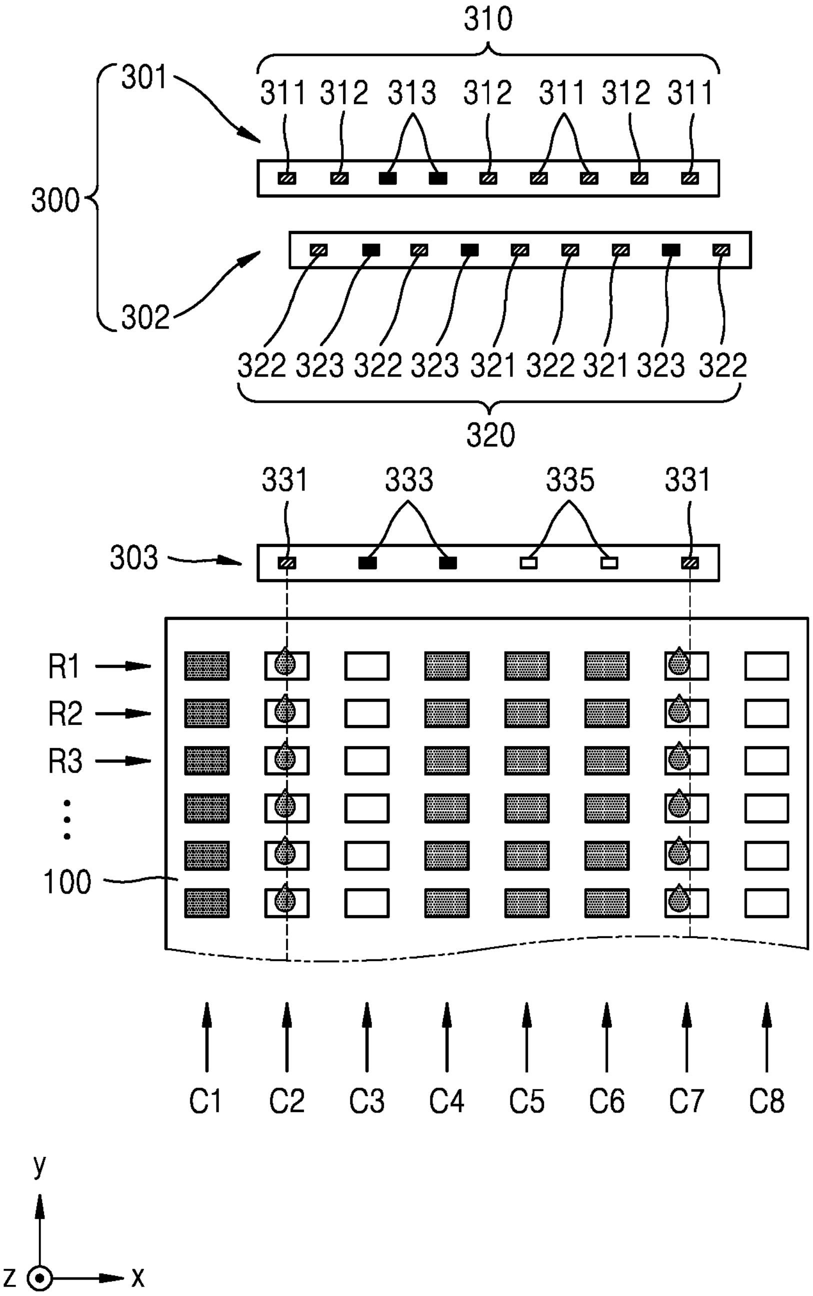
FIGS. 17 and 18 are conceptual views schematically illustrating a comparative example of processes of a method of manufacturing a display apparatus.
Figure 18:
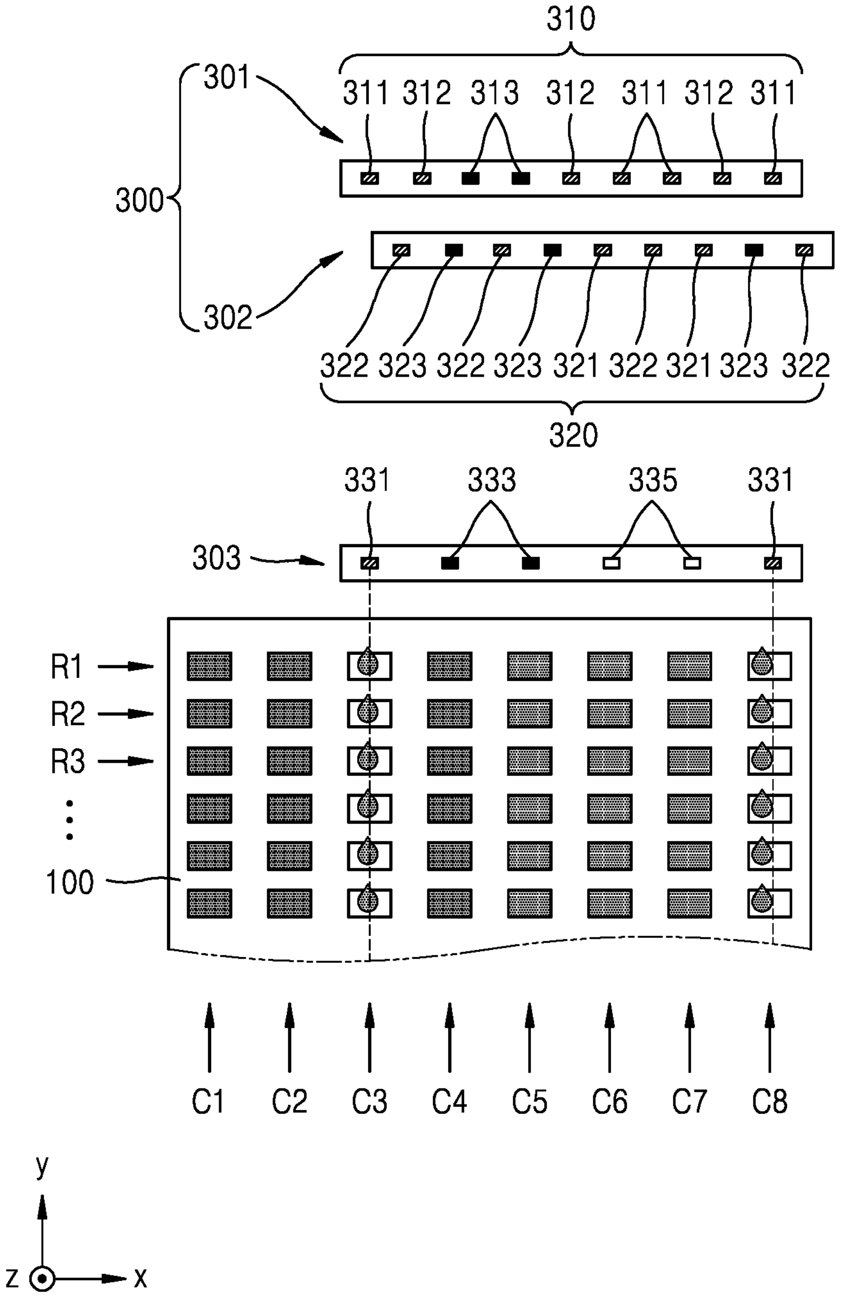

Thereafter, in the case of a method of manufacturing a display apparatus, according to a comparative example, red emission layers are formed by dotting the material for forming a red emission layer on other dotting areas through a process as shown in FIGS. 17 and 18.

In detail, as shown in FIG. 17, the headset 300 is arranged such that a leftmost third nozzle 331 from among the plurality of third nozzles corresponds to a leftmost dotting area of undotted dotting areas from among the plurality of dotting areas arranged on the first row R1. In FIG. 17, the headset 300 is arranged such that the leftmost third nozzle 331 from among the plurality of third nozzles corresponds to the second column C2. In this situation, from among the plurality of third nozzles, those corresponding to the undotted dotting areas are identified. For reference, when third nozzles 333 that do not operate correspond to some undotted dotting areas, it is considered that there are no corresponding third nozzles 333 for those some undotted dotting areas. In FIG. 17, from among the six third nozzles, the two third nozzles 331 arranged at the first and sixth positions correspond to the undotted dotting areas. In this state, the headset 300 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the second column C2 and the seventh column C7. Because dotting is performed only once at a time on the first column C1 and the sixth column C6, additional dotting is performed.

Subsequently, as shown in FIG. 18, the headset 300 is arranged such that the leftmost third nozzle 331 from among the plurality of third nozzles corresponds to the leftmost dotting area of the undotted dotting areas from among the plurality of dotting areas arranged on the first row R1. In FIG. 18, the headset 300 is arranged such that the leftmost third nozzle 331 from among the plurality of third nozzles corresponds to the third column C3. In this situation, from among the plurality of third nozzles, those corresponding to the undotted dotting areas are identified. In FIG. 18, from among the six third nozzles, the two third nozzles 331 arranged at the first and sixth positions correspond to the undotted dotting areas. In this state, the headset 300 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the third column C3 and the eighth column C8. Because dotting is performed only once at a time on the third column C3 and the eighth column C8, additional dotting is performed.

In the case of the manufacturing method according to the comparative example, through the processes shown in FIGS. 16 to 18, the position of the headset 300 in the first direction (x-axis direction) may be changed two times, and dotting may be performed six times while the headset 300 is moved in the second direction (y-axis direction), thereby forming red emission layers on eight columns. The reason for performing dotting six times is that, as described above, dotting is performed two times on each of the first column C1 and the sixth column C6, two times on each of the second column C2 and the seventh column 7C, and two times on each of the third column C3 and the eighth column C8.

In the case of the manufacturing method in the illustrated embodiment, as described above with reference to FIG. 16, red emission layers are formed by dotting the material for forming a red emission layer on the dotting areas arranged on the first column C1, the fourth column C4, the fifth column C5, and the sixth column C6. Dotting is performed once more on the first column C1 and the sixth column C6.

In addition, in a state in which the headset 300 is arranged as shown in FIGS. 15 and 16, from among dotting areas of one row, e.g., the dotting areas of the first row R1 arranged uppermost in the second direction (y-axis direction), dotting areas for which corresponding ones of the plurality of first nozzles 310 and the plurality of second nozzles 320 do not exist are identified as first dotting areas. The plurality of first nozzles 310 may include the first nozzles 313 that do not operate. Accordingly, from among the dotting areas of the first row R1, those corresponding to the first nozzles 313 that do not operate are considered as dotting areas for which corresponding ones of the plurality of first nozzles 310 do not exist, and thus are identified as belonging to the first dotting areas. The same applies to the second nozzles 320.

Subsequently, the position of the headset 300 is changed over the first row R1, while the first nozzle 310 or the second nozzle 320 corresponding to a leftmost dotting area from among the identified first dotting areas is changed. When the number of dotting areas from among the first dotting areas for which corresponding ones of the plurality of first nozzles 310 or the plurality of second nozzles 320 exist is maximized, a first nozzle or a second nozzle corresponding to the leftmost dotting area from among the first dotting areas is identified as a first target nozzle.

Figure 19:
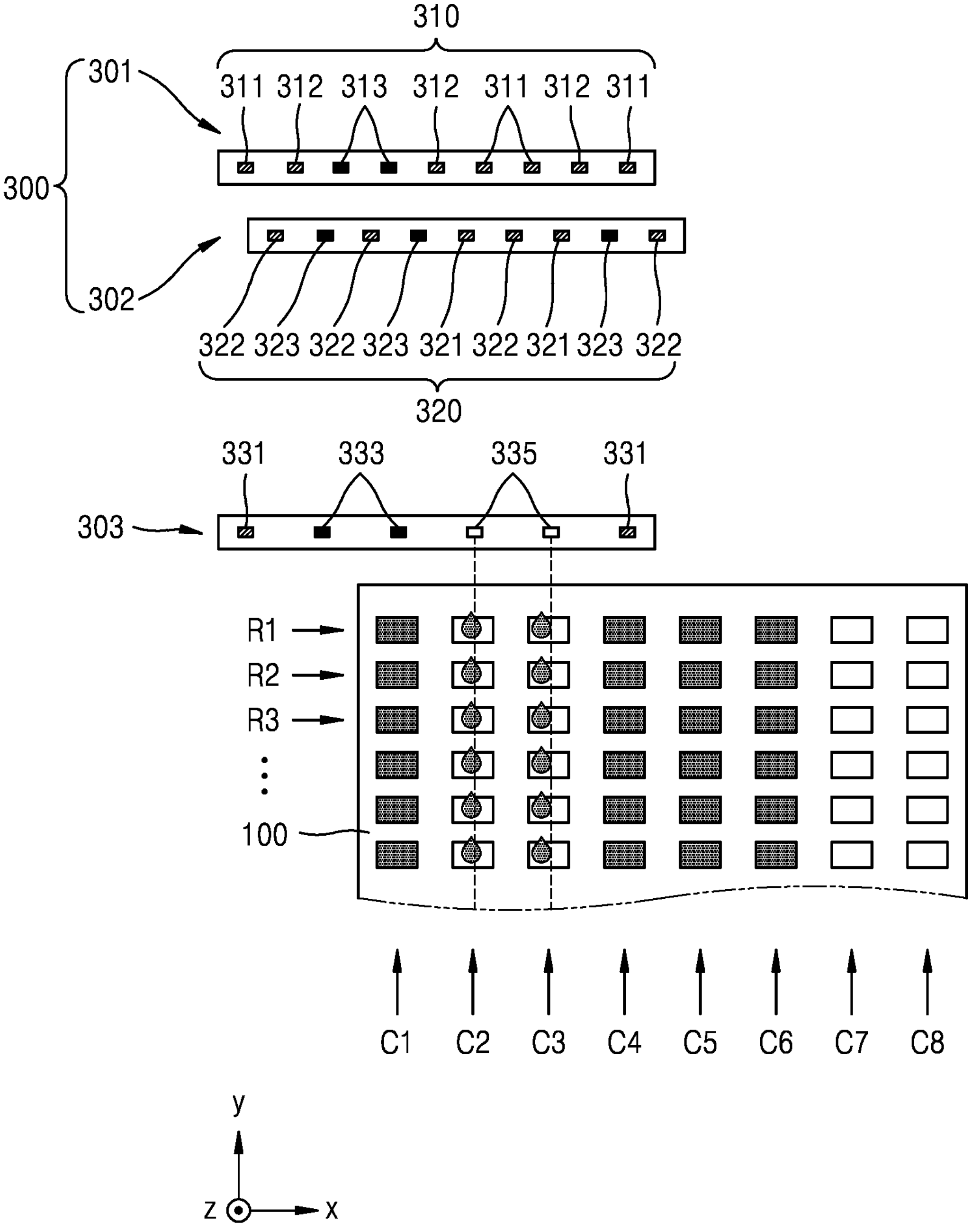
FIGS. 19 and 20 are conceptual views schematically illustrating an embodiment of processes of a method of manufacturing a display apparatus.

In an embodiment shown in FIG. 16, the leftmost dotting area from among the first dotting areas is the dotting area arranged in the second column C2, for example. Accordingly, as shown in FIG. 19, when the sixth first nozzle 311 of the first head 301 and the fifth second nozzle 321 of the second head 302 are arranged to correspond to the second column C2, the number of dotting areas from among undotted first dotting areas for which corresponding ones of the plurality of first nozzles 310 or the plurality of second nozzles 320 exist becomes two, which is a maximum value. Accordingly, the sixth first nozzle 311 of the first head 301 and the fifth second nozzle 321 of the second head 302 are identified as the first target nozzle.

For reference, as shown in FIG. 19, when a fourth third nozzle 335 of the virtual third head 303 is arranged to correspond to the second column C2, the number of dotting areas from among the undotted first dotting areas for which corresponding ones of the plurality of third nozzles exist becomes two, which is a maximum value. Accordingly, it may be understood that the fourth third nozzle 335 of the virtual third head 303 is identified as the first target nozzle.

Likewise, in the comparative example described above with reference to FIG. 17, the number of dotting areas from among the undotted first dotting areas for which corresponding ones of the plurality of first nozzles 310 or the plurality of second nozzles 320 exist may be two. However, in the case of FIG. 17, a first third nozzle 331 and a sixth third nozzle 331, which are capable of performing dotting only once at a time, correspond to the first dotting areas, whereas in the case of FIG. 19, the fourth third nozzle 335 and a fifth third nozzle 335, which are capable of performing dotting twice at a time, correspond to the first dotting areas. As described above, when the number of dotting areas from among the undotted first dotting areas for which corresponding ones of the plurality of first nozzles 310 or the plurality of second nozzles 320 exist is the same in two cases, a case where the number of dotting areas corresponding to the third nozzle 335, which is capable of performing dotting multiple times at a time, is relatively large may be preferred. Accordingly, as shown in FIG. 19, the sixth first nozzle 311 of the first head 301 and the fifth second nozzle 321 of the second head 302 may be identified as the first target nozzle.

Accordingly, as shown in FIG. 19, the headset 300 is arranged such that the first target nozzle from among the plurality of first nozzles 310 and the plurality of second nozzles 320, that is, the sixth first nozzle 311 of the first head 301 and the fifth second nozzle 321 of the second head 302, are arranged over a leftmost dotting area of dotting areas that are not dotted with ink from among the plurality of dotting areas of the first row R1, that is, on the second column C2. In addition, in this state, by the sixth first nozzle 311 and the seventh first nozzle 311 of the first head 301, and the fifth second nozzle 321 and the seventh second nozzle 321 of the second head 302, ink is dotted while the headset 300 is moved relative to the plurality of dotting areas in the second direction (y-axis direction). This may be understood as performing dotting by the fourth third nozzle 335 and the fifth third nozzle 335 of the virtual third head 303. Because the fourth third nozzle 335 and the fifth third nozzle 335 of the virtual third head 303 perform dotting twice at a time, the material for forming a red emission layer may be dotted on the dotting areas of the second column C2 and the third column C3 by performing printing once.

Subsequently, second dotting areas are identified. In detail, as shown in FIG. 19, in a state in which the headset 300 is arranged over one row, e.g., the first row R1, such that the first target nozzle corresponds to the leftmost dotting area from among the first dotting areas, dotting areas from among the first dotting areas for which corresponding ones of the plurality of first nozzles 310 and the plurality of second nozzles 320 do not exist are identified as the second dotting areas. The first dotting areas are areas that are not dotted in the situation shown in FIG. 16, and, from among the first dotting areas, those identified as the second dotting areas are areas that are not dotted even in the situation shown in FIG. 19. In the case of FIG. 19, dotting areas belonging to the seventh column C7 and the eighth column C8 become the second dotting areas.

Figure 20:
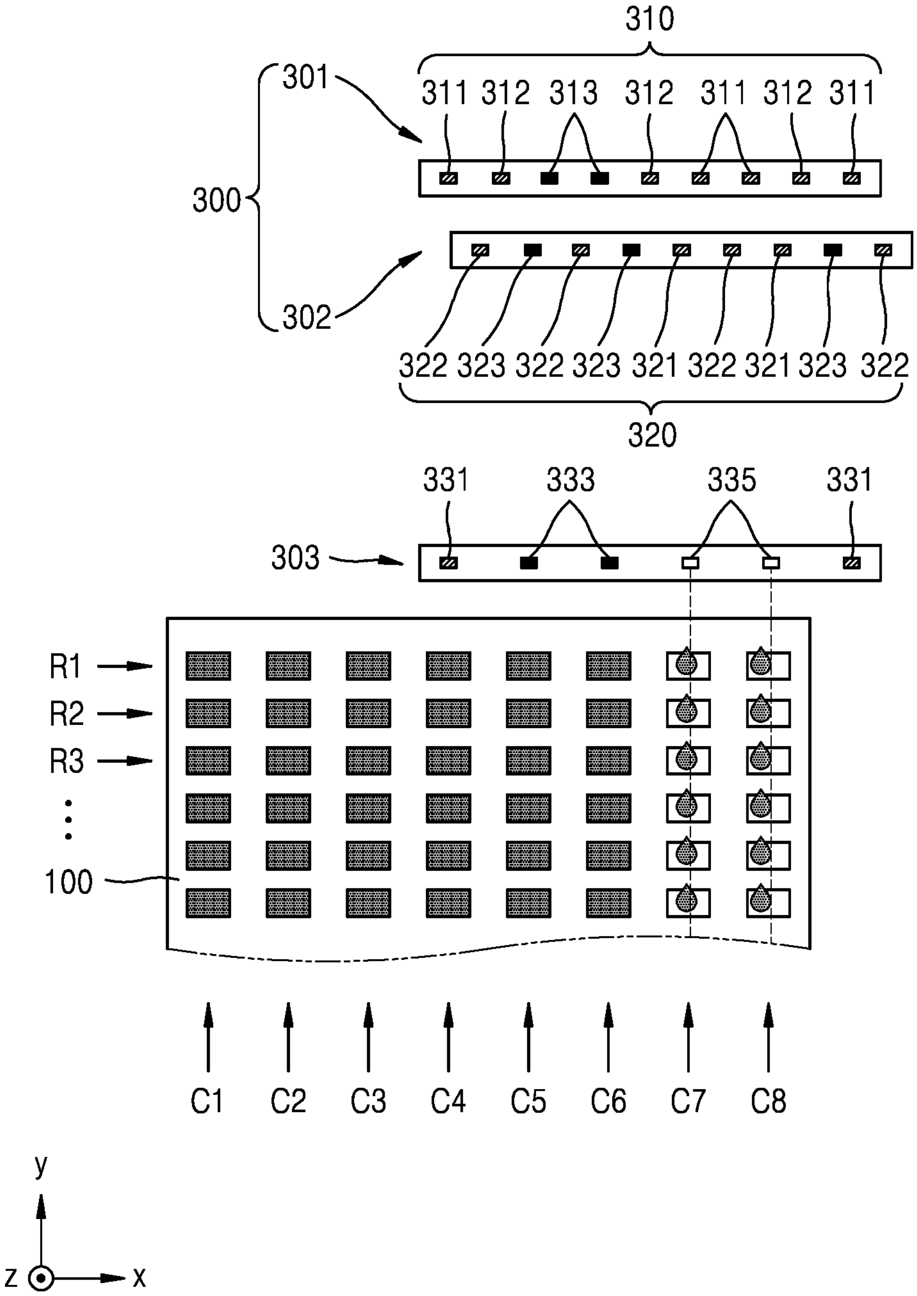

After identifying the second dotting areas, the position of the headset 300 is changed over one row, e.g., the first row R1 arranged uppermost in the second direction (y-axis direction). While the first nozzle 310 or the second nozzle 320 corresponding to a leftmost dotting area from among the second dotting areas is changed, when the number of dotting areas from among the second dotting areas for which corresponding ones of the plurality of first nozzles 310 and the plurality of second nozzles 320 exist is maximized, the first nozzle 310 or the second nozzle 320 corresponding to the leftmost dotting area from among the second dotting areas is identified as a second target nozzle. In the case shown in FIG. 19, because the second dotting areas are on the seventh column C7 and the eighth column C8, as described above, the leftmost dotting area from among the second dotting areas is the dotting area arranged on the seventh column C7. Accordingly, from among the first nozzles 310 and the second nozzles 320, the first nozzle 310 or the second nozzle 320 corresponding to the seventh column C7 is changed, and the second target nozzle is identified. As shown in FIG. 20, when the sixth first nozzle 311 of the first head 301 and the fifth second nozzle 321 of the second head 302 correspond to the seventh column C7, first nozzles 311 or second nozzles 321 corresponding to both the seventh column C7 and the eighth column C8 exist, and thus, the number of dotting areas from among the second dotting areas for which corresponding ones of the plurality of first nozzles 310 and the plurality of second nozzles 320 exist becomes two, which is a maximum value. Accordingly, the sixth first nozzle 311 of the first head 301 and the fifth second nozzle 321 of the second head 302 become the second target nozzle.

Accordingly, the headset 300 is arranged such that the sixth first nozzle 311 of the first head 301 and the fifth second nozzle 321 of the second head 302, which are the second target nozzle, are arranged over the seventh column C7 on which the leftmost dotting area from among the second dotting areas is disposed. In addition, in this state, the headset 300 is relatively moved in the second direction (y-axis direction) with respect to the substrate 100, and the material for forming a red emission layer is dotted on the substrate 100, so that red emission layers are formed by dotting the material for forming a red emission layer on the dotting areas arranged on the seventh column C7 and the eighth column C8. This may be understood as performing dotting by the fourth third nozzle 335 and the fifth third nozzle 335 of the virtual third head 303. Because the fourth third nozzle 335 and the fifth third nozzle 335 of the virtual third head 303 perform dotting twice at a time, the material for forming a red emission layer may be dotted on the dotting areas of the seventh column C7 and the eight column C8 by performing printing once.

In the case of the manufacturing method according to the comparative example as described above with reference to FIGS. 16 to 18, the position of the headset 300 in the first direction (x-axis direction) may be changed two times, and dotting may be performed six times while the headset 300 is moved in the second direction (y-axis direction), thereby forming red emission layers on eight columns. However, in the case of the manufacturing method in the illustrated embodiment as described above with reference to FIGS. 16, 19, and 20, the position of the headset 300 in the first direction (x-axis direction) may be changed two times, and dotting may be performed four times while the headset 300 is moved in the second direction (y-axis direction), thereby forming red emission layers on eight columns. Accordingly, a display apparatus may be efficiently manufactured in a relatively short time.

It is not desired to perform the identifying of the first target nozzle and/or the second target nozzle and the identifying of the first dotting area and/or the second dotting area each time a display apparatus is manufactured. When the size, resolution, or the like of a display apparatus to be manufactured is determined in a state in which the headset 300 is prepared, the first target nozzle and/or the target nozzle and the first dotting area and/or the second dotting area are identified. Thereafter, as long as the size and/or the resolution of the display apparatus to be manufactured is not changed, the display apparatus is manufactured using the first target nozzle and/or the second target nozzle and the first dotting area and/or the second dotting area as previously identified, while minimizing a change in the position of the headset 300. Accordingly, in addition to the method of manufacturing a display apparatus as described above, a method of setting inkjet printing, in which the first target nozzle and/or the second target nozzle and the first dotting area and/or the second dotting area are identified, is also within the scope of the disclosure.

According to the embodiments as described above, it is possible to implement a method of setting inkjet printing, by which inkjet printing may be performed efficiently, and a method of manufacturing a display apparatus by the same. However, the scope of the disclosure is not limited by these effects.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A method of setting inkjet printing, the method comprising:

arranging a headset comprising a first head and a second head, the first head including a plurality of first nozzles arranged in a first direction and the second head including a plurality of second nozzles arranged in the first direction, such that the plurality of first nozzles is arranged over one row including a plurality of dotting areas, and such that an outermost first nozzle from among the plurality of first nozzles corresponds to an outermost dotting area from among the plurality of dotting areas arranged on the one row and the outermost first nozzle is disposed further outside than an outermost second nozzle from among the plurality of second nozzles;

identifying, from among the plurality of dotting areas, dotting areas for which corresponding ones of the plurality of first nozzles and the plurality of second nozzles do not exist as first dotting areas; and changing a position of the headset over the one row while changing a first nozzle or second nozzle, from among the plurality of first nozzles and the plurality of second nozzles, corresponding to an outermost dotting area from among the first dotting areas, and, when a number of dotting areas from among the first dotting areas for which corresponding ones of the plurality of first nozzles or the plurality of second nozzles exist is maximized, identifying the first nozzle or second nozzle from among the plurality of first nozzles and the plurality of second nozzles which corresponds to the outermost dotting area from among the first dotting areas as a first target nozzle.

2. The method of claim 1, further comprising:

in a state in which the headset is arranged over the one row such that the first target nozzle corresponds to the outermost dotting area from among the first dotting areas, identifying, from among the first dotting areas, dotting areas for which corresponding ones of the plurality of first nozzles and the plurality of second nozzles do not exist as second dotting areas; and changing the position of the headset over the one row while changing a first nozzle or second nozzle, from among the plurality of first nozzles and the plurality of second nozzles, corresponding to an outermost dotting area from among the second dotting areas, and, when a number of dotting areas from among the second dotting areas for which corresponding ones of the plurality of first nozzles and the plurality of second nozzles exist is maximized, identifying the first nozzle or second nozzle among the plurality of first nozzles and the plurality of second nozzles which corresponds to the outermost dotting area from among the second dotting areas as a second target nozzle.

3. A method of manufacturing a display apparatus, the method comprising:

arranging the headset according to the method of claim 1;

a first dotting operation of dotting ink by the plurality of first nozzles and the plurality of second nozzles while moving the headset relative to the plurality of dotting areas in a second direction intersecting with the first direction;

arranging the headset such that the first target nozzle identified from among the plurality of first nozzles and the plurality of second nozzles is arranged over an outermost dotting area of dotting areas which are not dotted with the ink and dotting areas which are dotted with the ink only once from among the plurality of dotting areas of the one row; and a second dotting operation of dotting the ink while moving the headset relative to the plurality of dotting areas in the second direction by, from among the plurality of first nozzles and the plurality of second nozzles, first nozzles and second nozzles corresponding to the dotting areas which are not dotted with the ink and the dotting areas which are dotted with the ink only once from among the plurality of dotting areas of the one row.

* * * * *